US 7,995,966 B2

(12) United States Patent
Sukegawa et al.

(10) Patent No.: US 7,995,966 B2
(45) Date of Patent: Aug. 9, 2011

(54) COMMUNICATION SEMICONDUCTOR CHIP, CALIBRATION METHOD, AND PROGRAM

(75) Inventors: Shunichi Sukegawa, Ibaraki (JP); Takeo Sekino, Saitama (JP); Kenichi Shigenami, Kanagawa (JP); Shinichi Toi, Kanagawa (JP); Tatsuo Shimizu, Chiba (JP)

(73) Assignee: Sony Corporation, Tokyo (JP)

( * ) Notice: Subject to any disclaimer, the term of this patent is extended or adjusted under 35 U.S.C. 154(b) by 879 days.

(21) Appl. No.: 11/554,817

(22) Filed: Oct. 31, 2006

(65) Prior Publication Data

US 2007/0120569 A1 May 31, 2007

(30) Foreign Application Priority Data

Nov. 2, 2005 (JP) ................. 2005-319367

(51) Int. Cl.
*H04B 7/00* (2006.01)
(52) U.S. Cl. .......................... 455/41.2; 455/70
(58) Field of Classification Search .......... 455/254, 455/41.2, 70; 324/500
See application file for complete search history.

(56) References Cited

U.S. PATENT DOCUMENTS

| | | | | |
|---|---|---|---|---|
| 4,619,002 A * | 10/1986 | Thro | ............... | 455/226.2 |
| 5,689,428 A * | 11/1997 | Sauerbrey et al. | ............... | 702/60 |
| 5,696,772 A * | 12/1997 | Lesmeister | ............... | 714/32 |
| 7,031,683 B2 * | 4/2006 | Vishakhadatta et al. | ... | 455/197.2 |
| 7,177,610 B2 * | 2/2007 | Scott et al. | ............... | 455/259 |
| 2003/0126356 A1 * | 7/2003 | Gustavson et al. | ............... | 711/105 |
| 2004/0203381 A1 * | 10/2004 | Cahn et al. | ............... | 455/41.2 |
| 2004/0225461 A1 * | 11/2004 | Floyd et al. | ............... | 702/85 |
| 2005/0028050 A1 * | 2/2005 | Ganry | ............... | 714/700 |
| 2005/0075080 A1 * | 4/2005 | Zhang | ............... | 455/73 |
| 2005/0125184 A1 * | 6/2005 | Ye et al. | ............... | 702/117 |
| 2005/0288893 A1 * | 12/2005 | Gassner | ............... | 702/182 |

FOREIGN PATENT DOCUMENTS

| | | |
|---|---|---|
| JP | 8-316408 | 11/1996 |
| JP | 9-246461 A | 9/1997 |
| JP | 11-68033 A | 3/1999 |
| JP | 2004-327568 A | 11/2004 |
| JP | 2005-203657 A | 7/2005 |
| JP | 2005-228785 A | 8/2005 |
| JP | 2005-228981 A | 8/2005 |
| JP | 2005-311657 A | 11/2005 |
| JP | 2006-93659 A | 4/2006 |
| WO | WO 2005/078795 A1 | 8/2005 |

OTHER PUBLICATIONS

Davis et al., "Automatic Registration in an Electron-Beam Lithographic System", IBM Journal of Research and Development, Nov. 1977, Issue 6, pp. 489-505.*
Japanese Office Action issued Sep. 21, 2010 in corresponding Japanese Application No. 2005-319367.

* cited by examiner

*Primary Examiner* — Nguyen Vo
*Assistant Examiner* — Ganiyu Hanidu
(74) *Attorney, Agent, or Firm* — Oblon, Spivak, McClelland, Maier & Neustadt, L.L.P.

(57) ABSTRACT

A communication semiconductor chip performs wireless communication with another communication semiconductor chip. The semiconductor chip includes a communication module and a control unit. The communication module performs the wireless communication with another communication semiconductor chip and has a receiving circuit for receiving data. The control unit supplies a reference voltage to the receiving circuit and performs a calibration operation on the reference voltage.

14 Claims, 34 Drawing Sheets

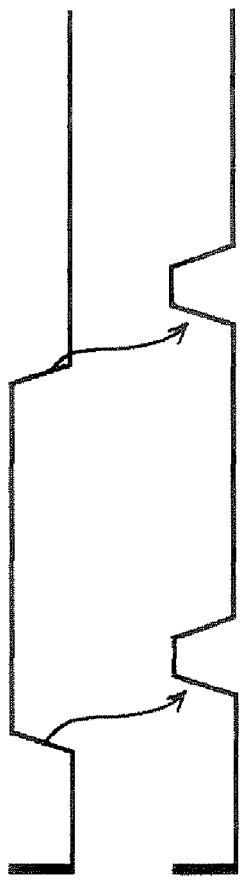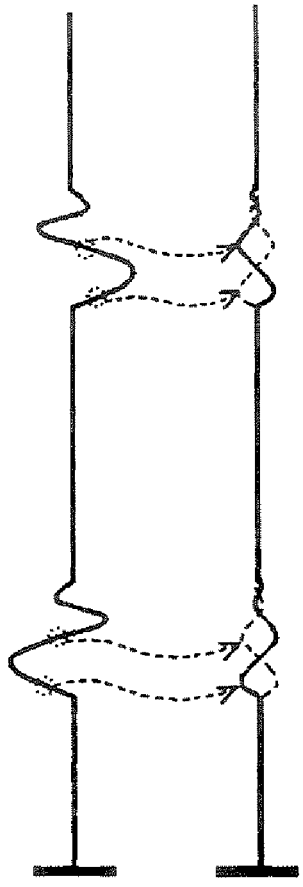
FIG. 11A DATA [V]
FIG. 11B N0 [V]
FIG. 11C N5 [V]
FIG. 11D ILT [A]
FIG. 11E N3/N4T [V]

FIG. 21A  CLK [V]
FIG. 21B  N3 [V]
FIG. 21C  DATA [V]
FIG. 21D  ILT [A]
FIG. 21E  N3/N4T [V]

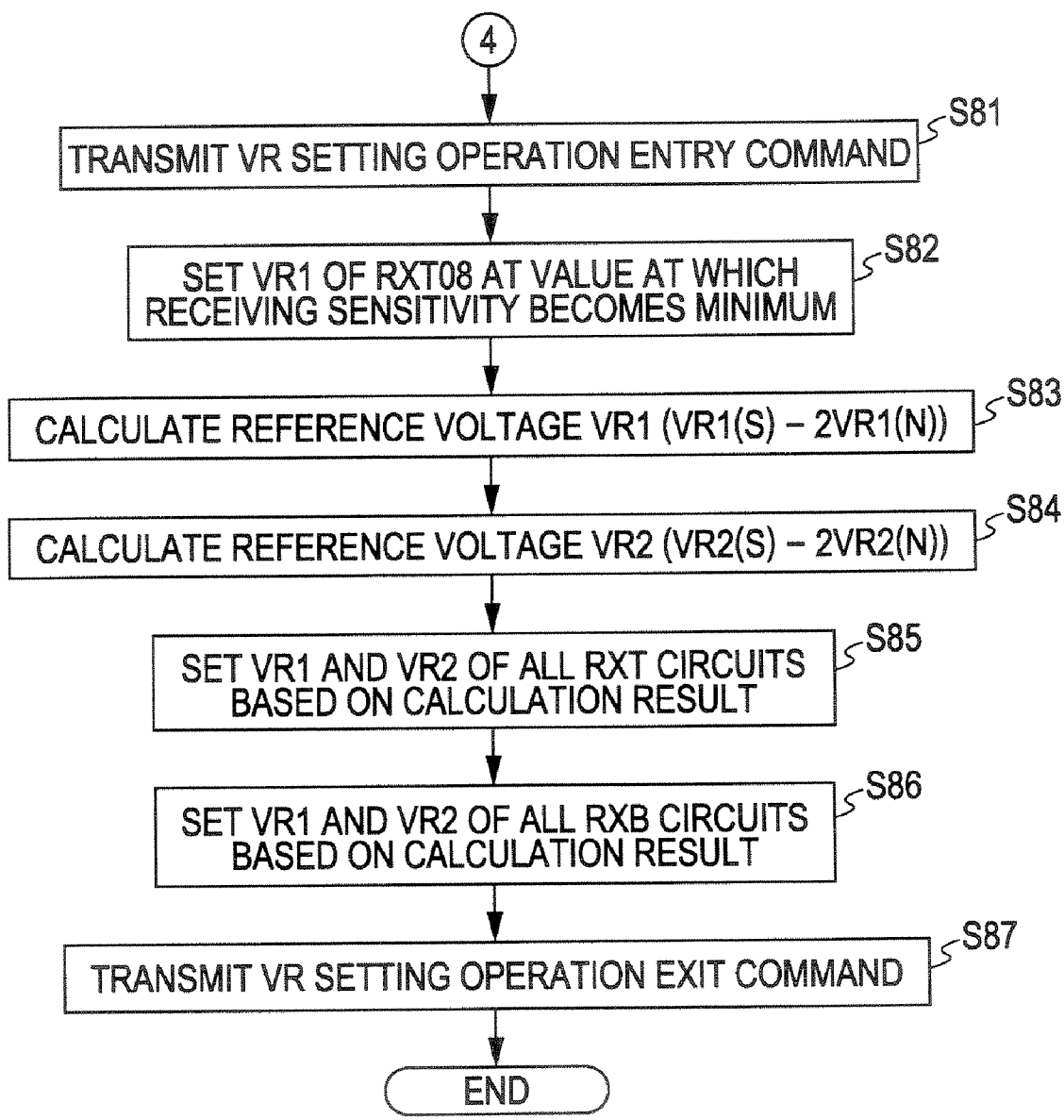

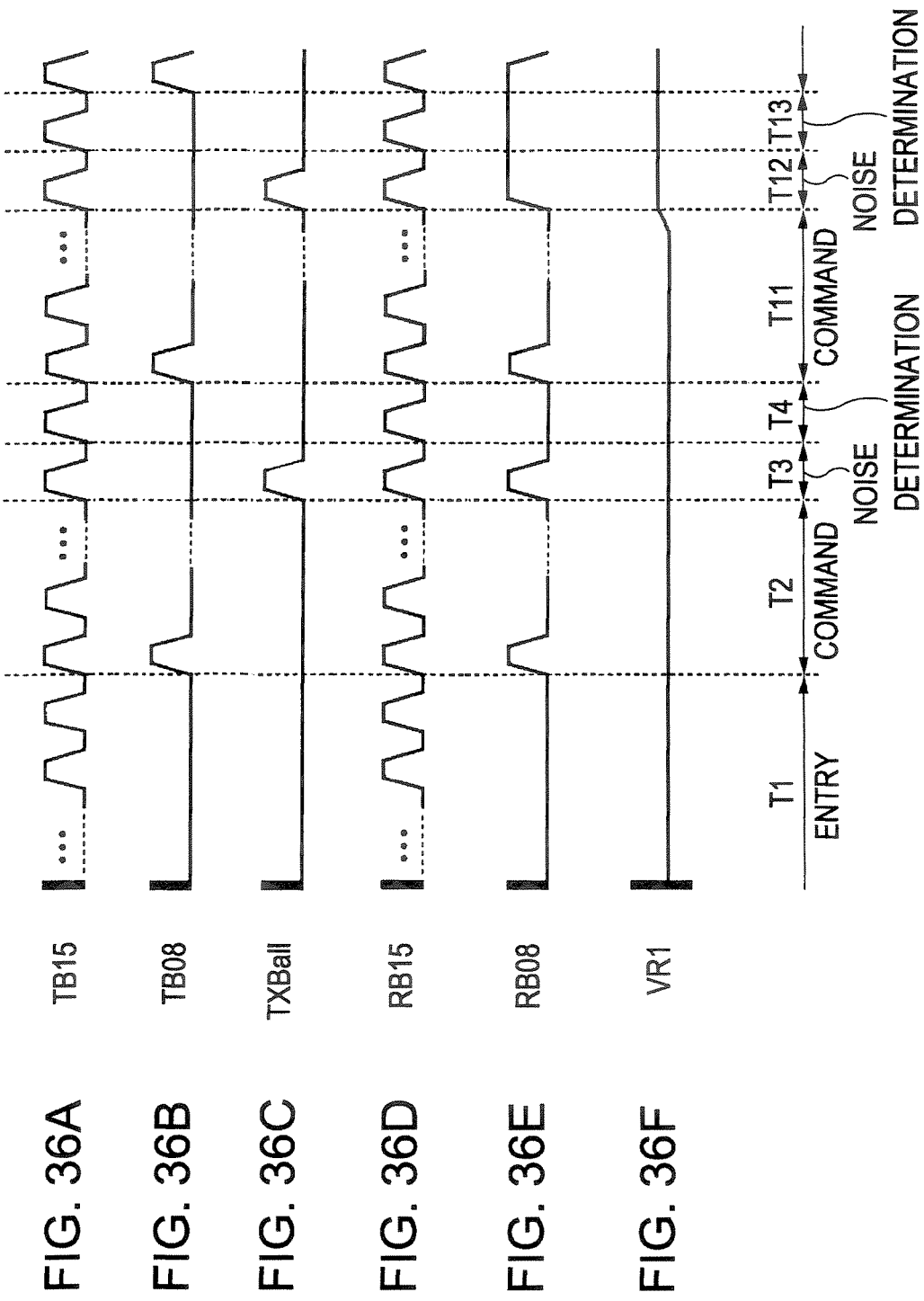

COMMUNICATION SEMICONDUCTOR CHIP, CALIBRATION METHOD, AND PROGRAM

CROSS REFERENCES TO RELATED APPLICATIONS

The present invention contains subject matter related to Japanese Patent Application JP 2005-319367 filed in the Japanese Patent Office on Nov. 2, 2005, the entire contents of which are incorporated herein by reference.

BACKGROUND OF THE INVENTION

1. Field of the Invention

The present invention relates to communication semiconductor chips, calibration methods, and programs. In particular, the present invention relates to a communication semiconductor chip that allows miniaturization of a semiconductor device and stable communication in the communication semiconductor chip, a calibration method, and a program.

2. Description of the Related Art

With widespread use of electronic devices, multi-chip packages having layered multi-chip modules (MCMs), layering technologies implementing system in packages (SIPs) at a low cost, and inter-chip wiring technologies are suggested (see, for example, Japanese Unexamined Patent Application Publication No. 8-316408).

In a device suggested in the above-cited patent document, a plurality of boards are layered, and another board is coupled to a side face of the layered boards. Terminals of the layered boards are connected to terminals mounted at a lower part through the board coupled to the side face.

SUMMARY OF THE INVENTION

However, in a method described in the above-cited patent document, the number of terminals of layered boards is limited by the width of a board coupled to a side face of the layered boards (hereinafter, referred to as a "side board"). When the number of terminals exceeds the limit of the side board, the number of side boards has to be increased. However, since the layered boards have only four side faces, it may be impossible to gain an area for the terminals, which has a total width larger than quadruple the width of the side board. Accordingly, the width of the side board has to be increased in order to allow more terminals. However, this leads to an increase in size of the entire semiconductor device.

Embodiments of the present invention are made in view of such circumstances, and provide a communication semiconductor chip that allows miniaturization of a semiconductor device having many terminals.

According to an aspect of the present invention, a communication semiconductor chip, which performs wireless communication with another communication semiconductor chip, includes a communication module that performs the wireless communication with another communication semiconductor chip and has a receiving circuit for receiving data, and a control unit that supplies a reference voltage to the receiving circuit and performs a calibration operation on the reference voltage.

The control unit may perform the calibration operation on the reference voltages, which may be a first reference voltage that allows adjustment of a receiving sensitivity of the receiving circuit at a rising edge of a received signal or a second reference voltage that allows adjustment of the receiving sensitivity of the receiving circuit at a falling edge of the received signal. The control unit may supply the first or second reference voltage to the receiving circuit.

The control unit may perform the calibration operation on the reference voltage using an unnecessary noise signal obtained in the wireless communication and the calibration operation on the reference voltage using a desired communication signal in the wireless communication.

A plurality of communication modules may be mounted on the communication semiconductor chip, and each of the communication modules may communicate with a corresponding communication module mounted at a corresponding position among a plurality of communication modules mounted on another communication semiconductor chip, and receive data.

The control unit may perform the calibration operation on the reference voltage using an unnecessary noise signal including an adjacent interference noise signal transmitted from the communication module mounted at a position other than the corresponding position in another communication semiconductor chip.

The control unit may perform the calibration operation on the reference voltage in at least one communication module among the plurality of communication modules, and supplies the obtained reference voltage to other communication modules.

During the calibration operation on the reference voltage, the control unit may supply a reference voltage that allows a maximum receiving sensitivity of the communication module to other communication modules on which the calibration operation is not performed.

The plurality of communication modules may be arranged in a matrix in a plane on the communication semiconductor chip.

According to another aspect of the present invention, a method for performing a calibration operation on a reference voltage supplied to a receiving circuit in a semiconductor device having a plurality of communication semiconductor chips, each having a communication module, that perform wireless communication with each other using the communication module is provided. The communication module has at least one of a transmitting circuit for transmitting signals and a receiving circuit for receiving signals, and performs the wireless communication using the transmitting circuit or the receiving circuit. The method includes the steps of selecting at least one of the communication modules having the receiving circuit as a communication module for setting in which the calibration operation is performed on the reference voltage, causing a communication module for transmission, which transmits a signal to the communication module for setting, to transmit the signal to the communication module for setting by supplying a predetermined signal to the communication module for transmission, detecting the signal transmitted from the communication module for transmission and received by the communication module for setting through a loop path constructed by at least some of the plurality of communication semiconductor chips, and performing the calibration operation on the reference voltage on the basis of the result of the signal detection.

According to still another aspect of the present invention, a program causing a computer to perform a calibration operation on a reference voltage supplied to a receiving circuit in a semiconductor device having a plurality of communication semiconductor chips, each having a communication module, that perform wireless communication with each other using the communication module is provided. The communication module has at least one of a transmitting circuit for transmitting signals and a receiving circuit for receiving signals, and performs the wireless communication using the transmitting circuit or the receiving circuit. The program includes the steps of selecting at least one of the communication modules having the receiving circuit as a communication module for setting in which the calibration operation is performed on the reference voltage, causing a communication module for transmission, which transmits a signal to the communication module for setting, to transmit the signal to the communication module for setting by supplying a predetermined signal to the communication module for transmission, detecting the signal transmitted from the communication module for transmission and received by the communication module for setting through a loop path constructed by at least some of the plurality of the communication semiconductor chips, and performing the calibration operation on the reference voltage on the basis of the result of the signal detection.

In the above-described aspect of the present invention, a communication semiconductor chip includes a communication module that performs wireless communication with another communication semiconductor chip and has a receiving circuit for receiving data, and a control unit that supplies a reference voltage to the receiving circuit and performs a calibration operation on the reference voltage.

In the above-described aspect of the present invention, at least one of the communication modules having the receiving circuit is selected as a communication module for setting in which the calibration operation is performed on the reference voltage. A communication module for transmission, which transmits a signal to the communication module for setting, is caused to transmit the signal to the communication module for setting by being supplied with a predetermined signal. The signal transmitted from the communication module for transmission and received by the communication module for setting is detected through a loop path constructed by at least some of the plurality of communication semiconductor chips. The calibration operation is performed on the reference voltage on the basis of the result of the signal detection.

An aspect of the present invention can provide a communication semiconductor chip. More specifically, the aspect of the present invention can implement a communication semiconductor chip that allows miniaturization of a semiconductor device having many terminals.

Another aspect of the present invention can implement a communication semiconductor chip allowing communication to be performed more easily and more stably.

Still another aspect of the present invention can implement a communication semiconductor chip allowing communication to be performed in a broader communication range more easily.

A further aspect of the present invention can provide a calibration method performed on parameters used in a communication semiconductor chip. More specifically, the aspect of the present invention allows the calibration operation to be performed on the parameters more easily in order to allow more stable communication.

A still further aspect of the present invention can provide a program implementing a calibration operation performed on parameters used in a communication semiconductor chip. More specifically, the aspect of the present invention allows the calibration operation to be performed on the parameters more easily in order to allow more stable communication.

BRIEF DESCRIPTION OF THE DRAWINGS

FIGS. 11A to 11E are wave-form charts illustrating an operation performed in a transmitting circuit shown in FIG. 10;

FIGS. 21A to 21E are wave-form charts illustrating an operation performed in a transmitting circuit shown in FIG. 20;

FIG. 35 is a flowchart, continued from FIG. 34, illustrating an example of a calibration operation; and FIGS. 36A to 36F are timing charts each showing an example wave-form of signal regarding a calibration operation.

DESCRIPTION OF THE PREFERRED EMBODIMENTS

Figure 1:
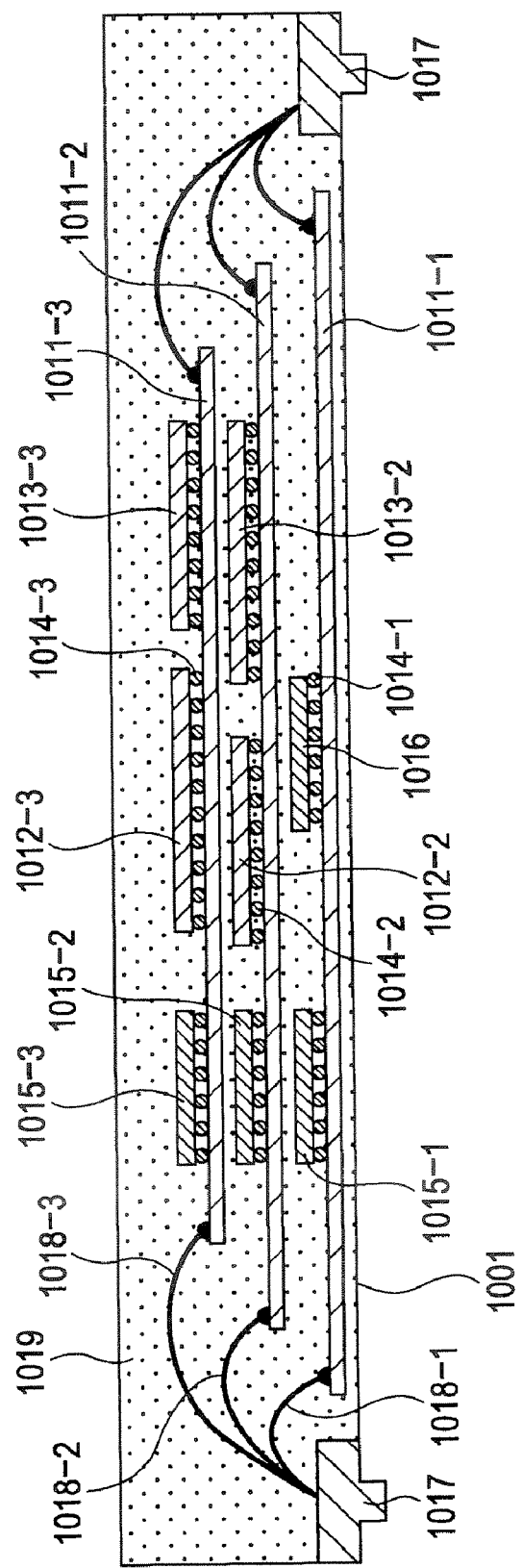
FIG. 1 is a sectional side view showing a configuration of a multi-chip package according to an embodiment of the present invention.

Before describing an embodiment of the present invention, the correspondence between the features of the present invention and the specific elements disclosed in embodiments described in detailed description of the present invention is discussed below. This description is intended to assure that embodiments supporting the claimed invention are described in the detailed description in this specification. Thus, even if an element in the following embodiments is not described as relating to a certain feature of the present invention, that does not necessarily mean that the element does not relate to that feature of the claims. Conversely, even if an element is described herein as relating to a certain feature of the claims, that does not necessarily mean that the element does not relate to other features of the claims.

Furthermore, this description should not be construed as restricting that all the aspects of the invention disclosed in the embodiments are described in the claims. That is, the description does not deny the existence of aspects of the present invention that are described in the embodiments but not claimed in the invention of this application, i.e., the existence of aspects of the present invention that in future may be claimed by a divisional application, or that may be additionally claimed through amendments.

According to an aspect of the present invention, a communication semiconductor chip (for example, a communication chip shown in FIG. 29), which performs wireless communication with another communication semiconductor chip (for example, a communication chip 1015DT shown in FIG. 29), includes a communication module (for example, a communication module shown in FIG. 30) that performs the wireless communication with another communication semiconductor chip and has a receiving circuit (for example, an asynchronous receiving circuit shown in FIG. 30) for receiving data, and a control unit (for example, a control unit shown in FIG. 29) that supplies a reference voltage (for example, reference voltages VR1 and VR2 shown in FIG. 30) to the receiving circuit and performs a calibration operation on the reference voltage.

The control unit may perform the calibration operation on the reference voltages, which may be a first reference voltage (for example, a reference voltage VR1 shown in FIG. 30) that allows adjustment of a receiving sensitivity of the receiving circuit at a rising edge of a received signal or a second reference voltage (for example, a reference voltage VR2 shown in FIG. 30) that allows adjustment of the receiving sensitivity of the receiving circuit at a falling edge of the received signal. The control unit may supply the first or second reference voltage to the receiving circuit.

The control unit may perform the calibration operation (for example, STEPs S1 to S11 shown in FIG. 31 and STEPs S21 to S29 shown in FIG. 32) on the reference voltage using an unnecessary noise signal obtained in the wireless communication and the calibration operation (for example, STEPs S41 to S51 shown in FIG. 33 and STEPs S61 and S71 shown in FIG. 34) on the reference voltage using a desired communication signal in the wireless communication.

A plurality of communication modules may be mounted on the communication semiconductor chip (for example, a communication chip shown in FIG. 14), and each of the communication modules may communicate with a corresponding communication module mounted at a corresponding position among a plurality of communication modules mounted on another communication semiconductor chip, and receive data.

The control unit may perform the calibration operation (for example, STEPs S1 and S11 shown in FIG. 31 and STEPs S21 to S29 shown in FIG. 32) on the reference voltage using an unnecessary noise signal including an adjacent interference noise signal transmitted from the communication module mounted at a position other than the corresponding position in another communication semiconductor chip.

The control unit may perform the calibration operation on the reference voltage in at least one communication module among the plurality of communication modules, and supplies the obtained reference voltage to other communication modules (for example, a calibration operation shown in FIGS. 31 to 35).

Figure 31:
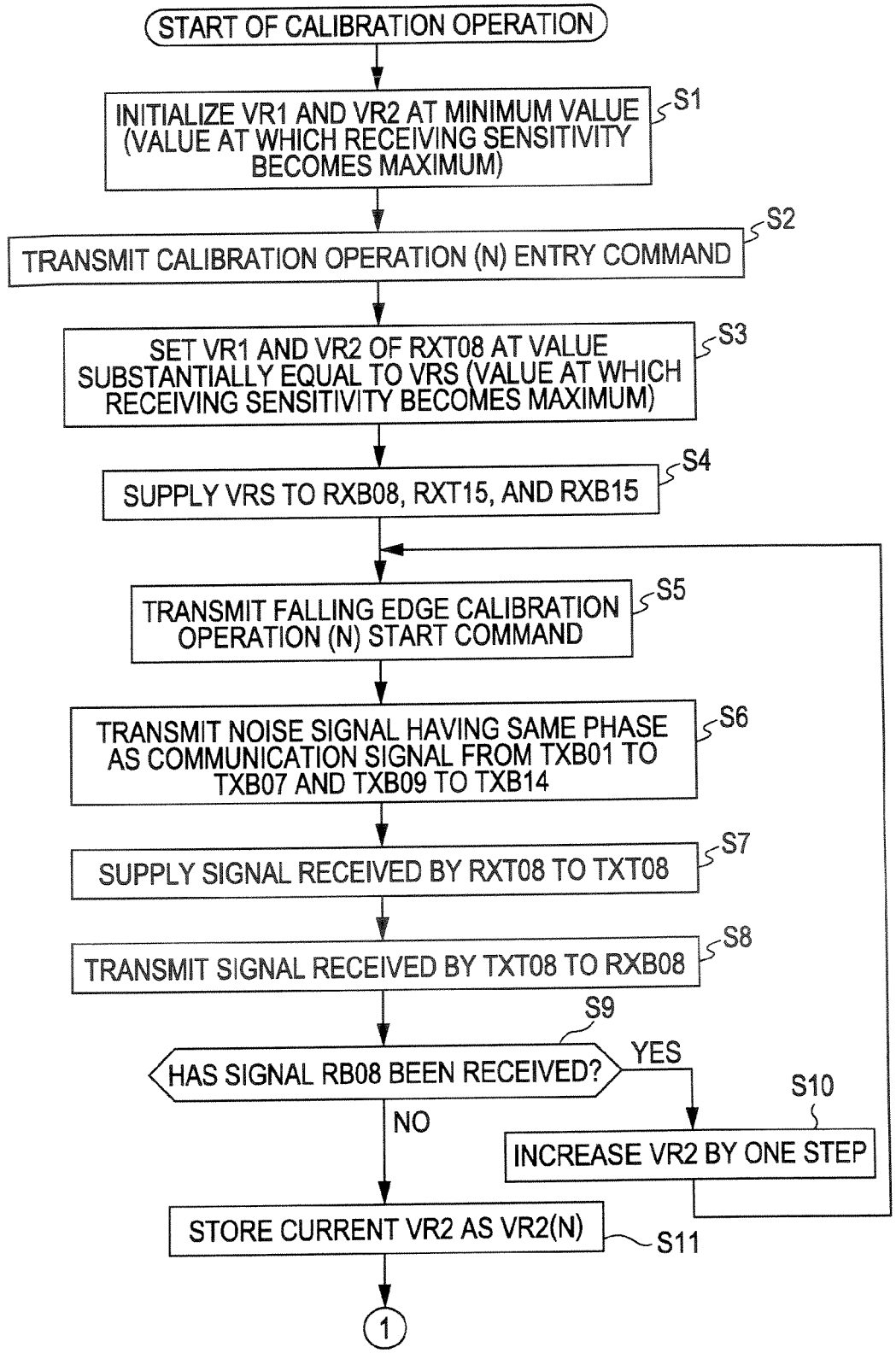
FIG. 31 is a flowchart illustrating an example of a calibration operation.

During the calibration operation on the reference voltage, the control unit may supply a reference voltage that allows a maximum receiving sensitivity of the communication module to other communication modules on which the calibration operation is not performed (for example, STEP S4 shown in FIG. 31).

Figure 14:
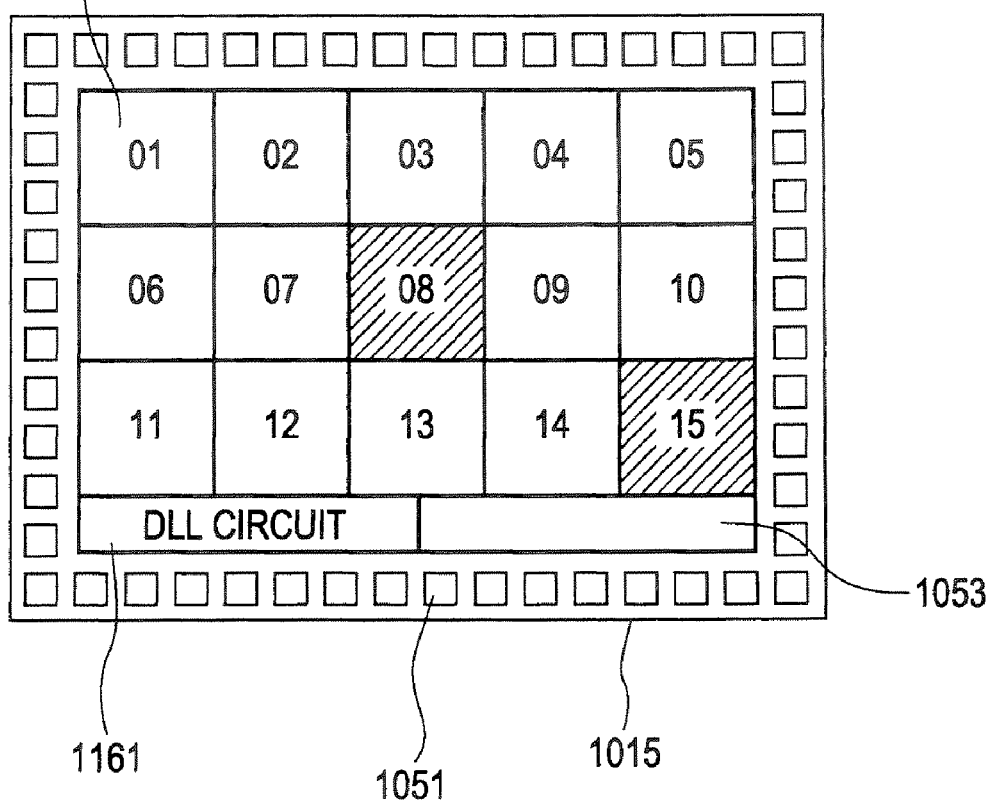
FIG. 14 is a plan view showing a configuration of a communication chip that performs synchronous communication.

The plurality of communication modules may be arranged in a matrix in a plane on the communication semiconductor chip (for example, a communication chip shown in FIG. 14).

According to another aspect of the present invention, a method for performing a calibration operation on a reference voltage supplied to a receiving circuit in a semiconductor device having a plurality of communication semiconductor chips, each having a communication module, that perform wireless communication with each other using the communication module is provided. The communication module has at least one of a transmitting circuit for transmitting signals and a receiving circuit for receiving signals, and performs the wireless communication using the transmitting circuit or the receiving circuit. The method includes the steps of selecting at least one of the communication modules having the receiving circuit as a communication module for setting in which the calibration operation is performed on the reference voltage (for example, STEP S3 shown in FIG. 31), causing a communication module for transmission, which transmits a signal to the communication module for setting, to transmit the signal to the communication module for setting by supplying a predetermined signal to the communication module for transmission (for example, STEP S6 shown in FIG. 31), detecting the signal transmitted from the communication module for transmission and received by the communication module for setting through a loop path constructed by at least some of the plurality of the communication semiconductor chips (for example, STEP S9 shown in FIG. 31), and performing the calibration operation on the reference voltage on the basis of the result of the signal detection (for example, STEPs S85 and S86 shown in FIG. 35).

According to still another aspect of the present invention, a program causing a computer to perform a calibration operation on a reference voltage supplied to a receiving circuit in a semiconductor device having a plurality of communication semiconductor chips, each having a communication module, that perform wireless communication with each other using the communication module is provided. The communication module has at least one of a transmitting circuit for transmitting signals and a receiving circuit for receiving signals, and performs the wireless communication using the transmitting circuit or the receiving circuit. The program includes the steps of selecting at least one of the communication modules having the receiving circuit as a communication module for setting in which the calibration operation is performed on the reference voltage (for example, STEP S3 shown in FIG. 31), causing a communication module for transmission, which transmits a signal to the communication module for setting, to transmit the signal to the communication module for setting by supplying a predetermined signal to the communication module for transmission (for example, STEP S6 shown in FIG. 31), detecting the signal transmitted from the communication module for transmission and received by the communication module for setting through a loop path constructed by at least some of the plurality of the communication semiconductor chips (for example, STEP S9 shown in FIG. 31), and performing the calibration operation on the reference voltage on the basis of the result of the signal detection (for example, STEPs S85 and S86 shown in FIG. 35).

Now, embodiments of the present invention will be described in detail below with reference to the accompanying drawings.

Figure 2:
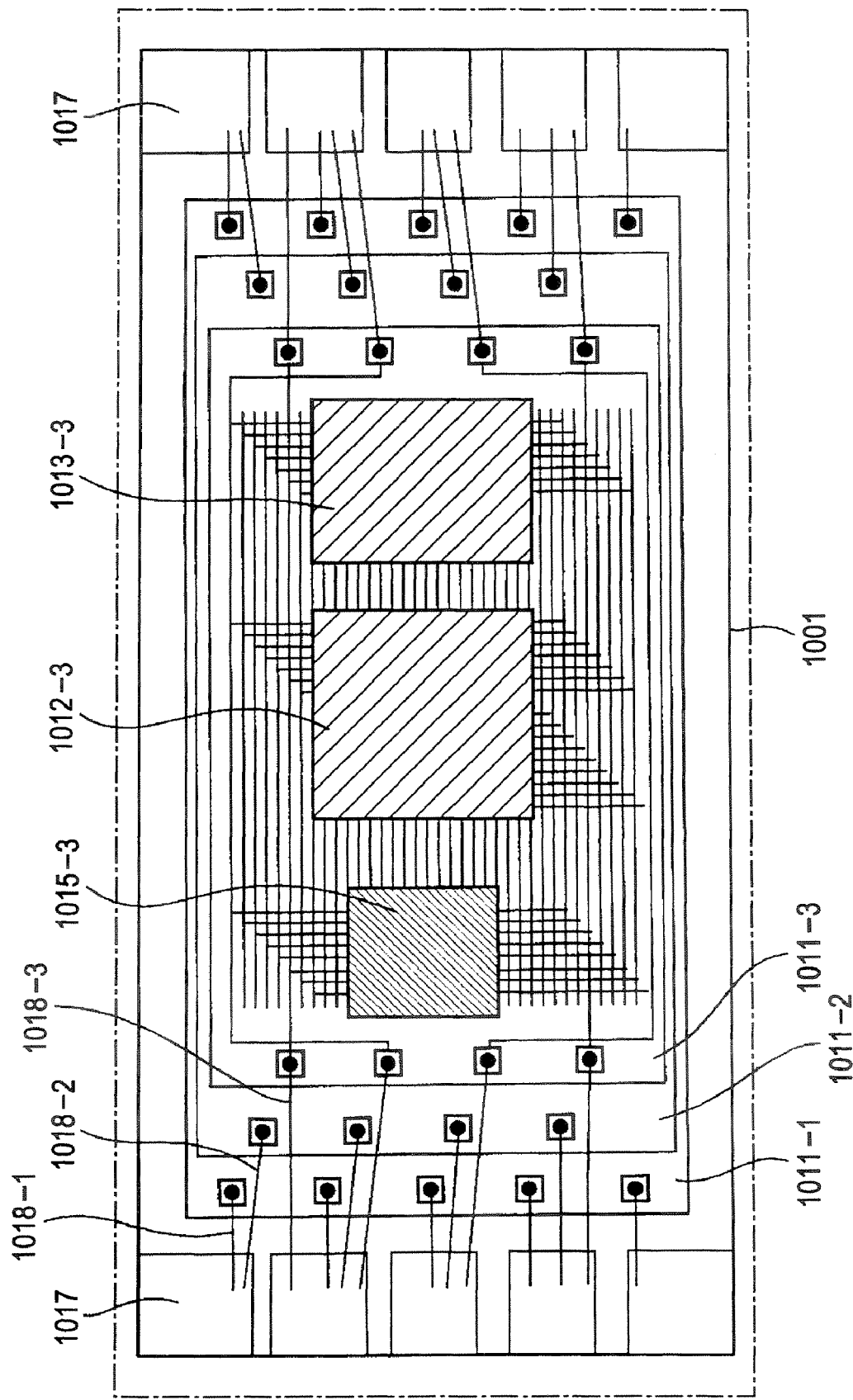
FIG. 2 is a plan view showing a configuration of a multi-chip package shown in FIG. 1.

FIG. 1 is a sectional side view of a multi-chip package according to an embodiment of the present invention, while FIG. 2 is a plan view of the multi-chip package. A multi-chip package 1001 is a semiconductor device that allows communication between interposers having semiconductor chips, on each of which an antenna is formed, installed thereon. The multi-chip package 1001, i.e., a semiconductor device, includes three silicon interposers 1011-1 to 1011-3. The interposer 1011-1, i.e., the bottom layer, has semiconductor communication chips 1015-1 and 1016 installed thereon via bumps 1014-1. The communication chips 1015-1 and 1016 are capable of exchanging signals with wiring patterns formed on the interposer 1011-1 although the illustration of the wiring patterns is omitted. In addition, necessary electric power is supplied to the interposer 1011-1 from power electrodes 1017 through bonding wires 1018-1.

The interposer 1011-2 has a semiconductor communication chip 1015-2 and function chips 1012-2 and 1013-2 installed thereon via bumps 1014-2. The communication chip 1015-2 and the function chips 1012-2 and 1013-2 are capable of exchanging signals with each other with wiring patterns formed on the interposer 1011-2. In addition, necessary electric power is supplied to the interposer 1011-2 from the power electrodes 1017 through bonding wires 1018-2.

The interposer 1011-3 has a semiconductor communication chip 1015-3 and function chips 1012-3 and 1013-3 installed thereon via bumps 1014-3. The communication chip 1015-3 and the function chips 1012-3 and 1013-3 are capable of exchanging signals with each other with wiring patterns formed on the interposer 1011-3. In addition, necessary electric power is supplied to the interposer 1011-3 from the power electrodes 1017 through bonding wires 1018-3.

The function chips 1012-2, 1012-3, 1013-2, and 1013-3 are semiconductor chips that perform predetermined functions of, for example, a CPU (Central Processing Unit) and a memory.

Figure 3:
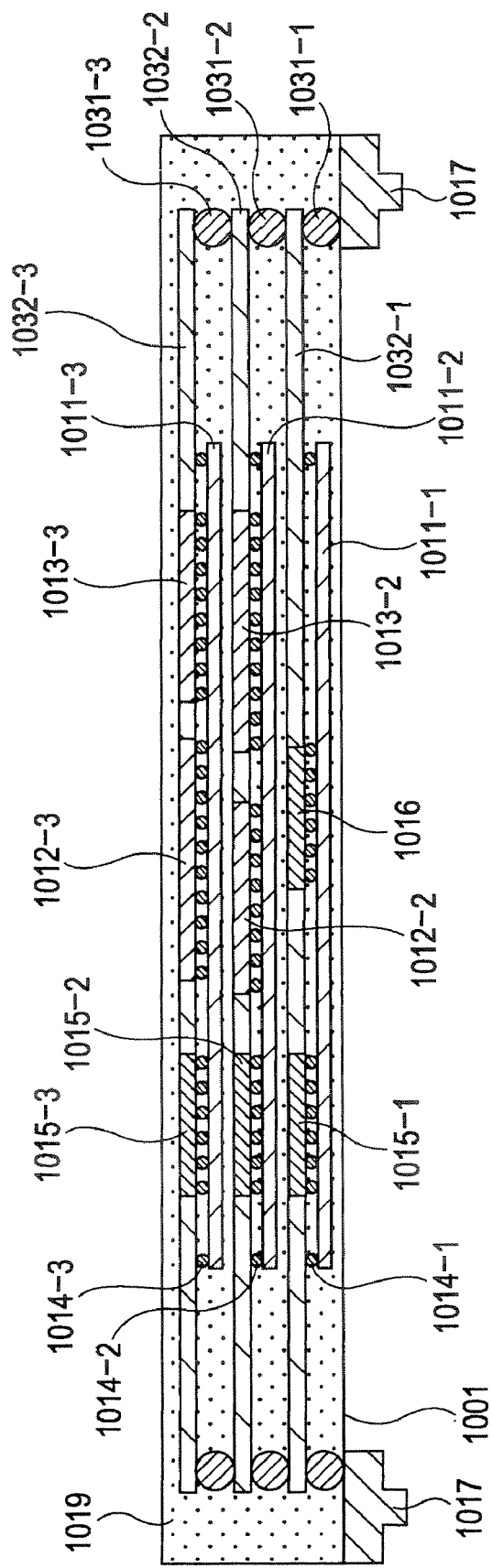
FIG. 3 is a sectional side view showing a configuration of a multi-chip package according to an embodiment of the present invention.
Figure 4:
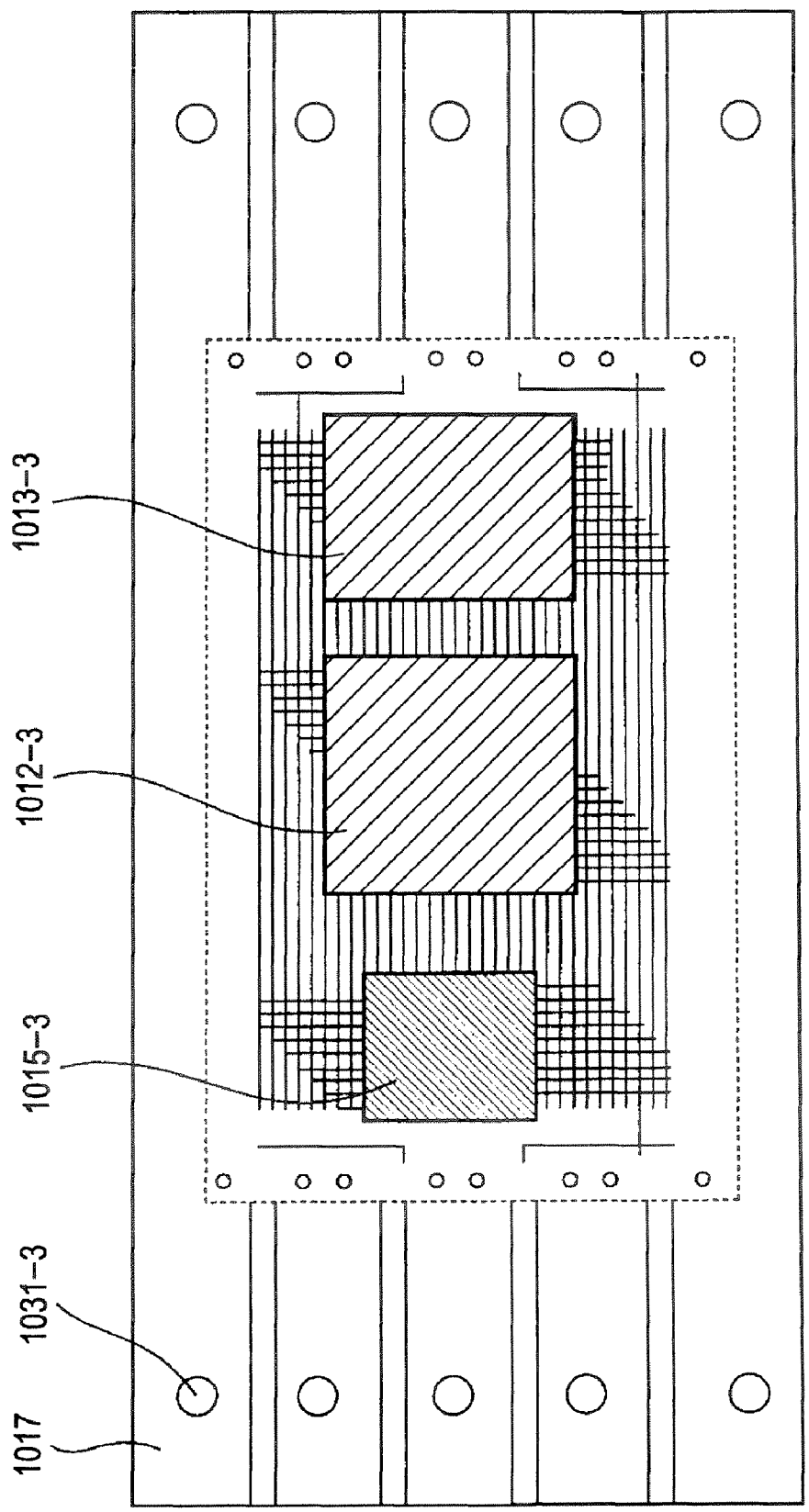
FIG. 4 is a plan view showing a configuration of a multi-chip package shown in FIG. 3.

FIGS. 3 and 4 shows a configuration of a multi-chip package according to another embodiment of the present invention. In this embodiment, necessary electric power is supplied to a copper plate 1032-1 from power electrodes 1017 through bumps 1031-1. The electric power is further supplied to an interposer 1011-1 through a bump 1014-1.

The electric power is supplied to a copper plate 1032-2 set above the copper plate 1032-1 from the power electrodes 1017 through the bumps 1031-1, the copper plate 1032-1, and bumps 1031-2. The electric power is further supplied to an interposer 1011-2 through a bump 1014-2. Similarly, the electric power is supplied to a copper plate 1032-3 set above the copper plate 1032-2 from the power electrodes 1017 through the bumps 1031-1, the copper plate 1032-1, the bumps 1031-2, the copper plate 1032-2, and bumps 1031-3. The electric power is further supplied to an interposer 1011-3 through a bump 1014-3. Except for the above configuration, the multi-chip package 1001 has the same configuration as that shown in FIGS. 1 and 2.

Holes are formed at positions corresponding to those of communication chips 1015-1 and 1016 of the copper plate 1032-1 such that the copper plate 1032-1 is configured so as not to be in direct contact with these chips. Likewise, holes are formed at positions corresponding to those of a communication chip 1015-2 and function chips 1012-2 and 1013-2 of the copper plate 1032-2, and at positions corresponding to those of a communication chip 1015-3 and function chips 1012-3 and 1013-3 of the copper plate 1032-3.

Figure 5:
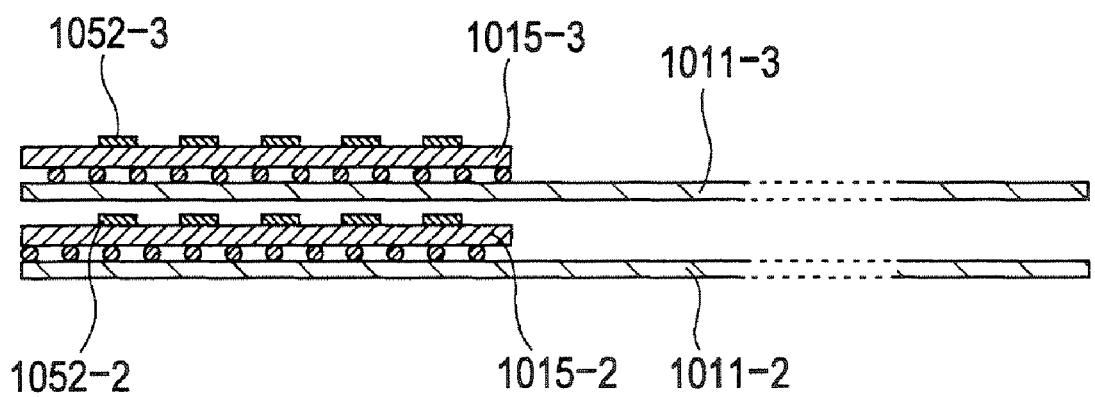
FIG. 5 illustrates communication between communication modules.

As shown in FIGS. 1 and 3, the communication chip 1015-1 is mounted at the position, in a vertical direction in the figures, corresponding to the position of the communication chips 1015-2 and 1015-3. More specifically, as shown in FIG. 5, for example, a communication module 1052-2 formed on the communication chip 1015-2 mounted on the interposer 1011-2 and a communication module 1052-3 formed on the communication chip 1015-3 mounted on the interposer 1011-3 are mounted at the corresponding positions. The communication chips 1015-2 and 1015-3 communicate with each other wirelessly (i.e., via electromagnetic induction) by the communication modules 1052-2 and 1052-3. More specifically, near field communication is performed.

Figure 6:
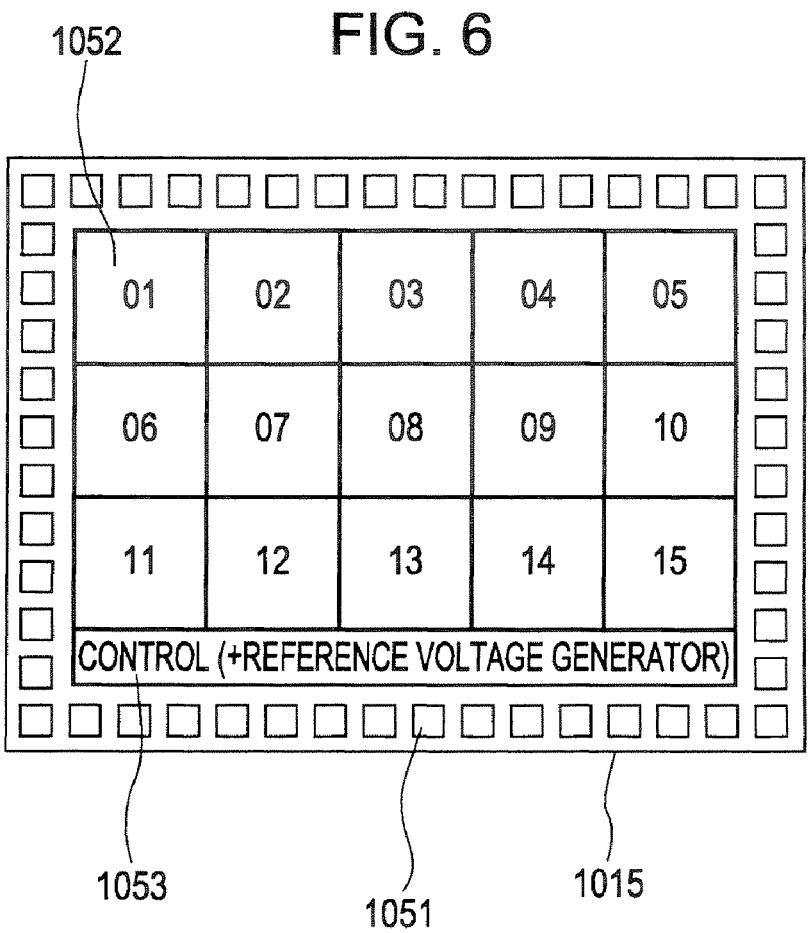
FIG. 6 is a plan view showing a configuration of a communication chip that performs asynchronous communication.

FIG. 6 is a plan view showing a configuration of the communication chip 1015 used for asynchronous communication. As shown in FIG. 6, in this embodiment, a plurality of pads 1051 are arranged sequentially along the circumference of the communication chip 1015 so as to form a square shape. The pads 1051 also include input/output buffers, and are connected to bonding wires or bumps. In addition, the pads 1051 are connected to the communication modules 1052 by wiring patterns.

In this embodiment, fifteen communication modules 1052 are arranged in a 3×5 matrix inside the part where the pads 1051 are mounted. The communication modules 1052 are mounted at positions denoted by numerals from 01 to 15. A control unit 1053 is formed at the position below the communication modules 1052 in the figure. The control unit 1053 controls the communication modules 1052 and generates a reference voltage before supplying the generated reference voltage to the communication modules 1052.

Figure 7:
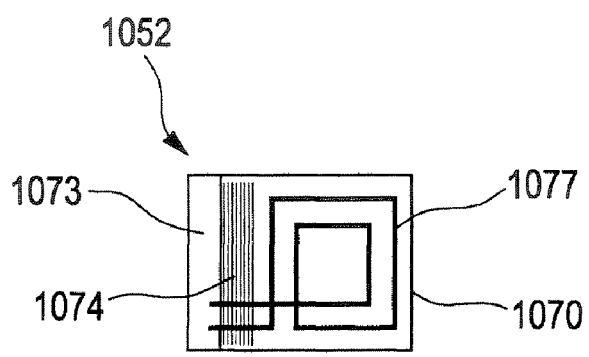
FIG. 7 is a plan view showing a planar configuration of a communication module shown in FIG. 6.

FIG. 7 is a plan view showing a configuration of a single communication module 1052. As shown in FIG. 7, a transmitting circuit 1073 is formed on the left side of the figure. On the right of the transmitting circuit 1073, an asynchronous receiving circuit 1074 is formed. On the right of the asynchronous receiving circuit 1074, an antenna 1077 is formed. A wiring 1070 is formed around the transmitting circuit 1073, the asynchronous receiving circuit 1074, and the antenna 1077. Electric power and signals are exchanged through the wiring 1070.

All of fifteen communication modules 1052 of the communication chip 1015 may be used for transmission or reception of signals. In this case, a communication chip for transmission and a communication chip for reception are used to perform two-way communication. Alternatively, some of the communication modules 1052 may be used for transmission and the rest may be used for reception.

Figure 8:
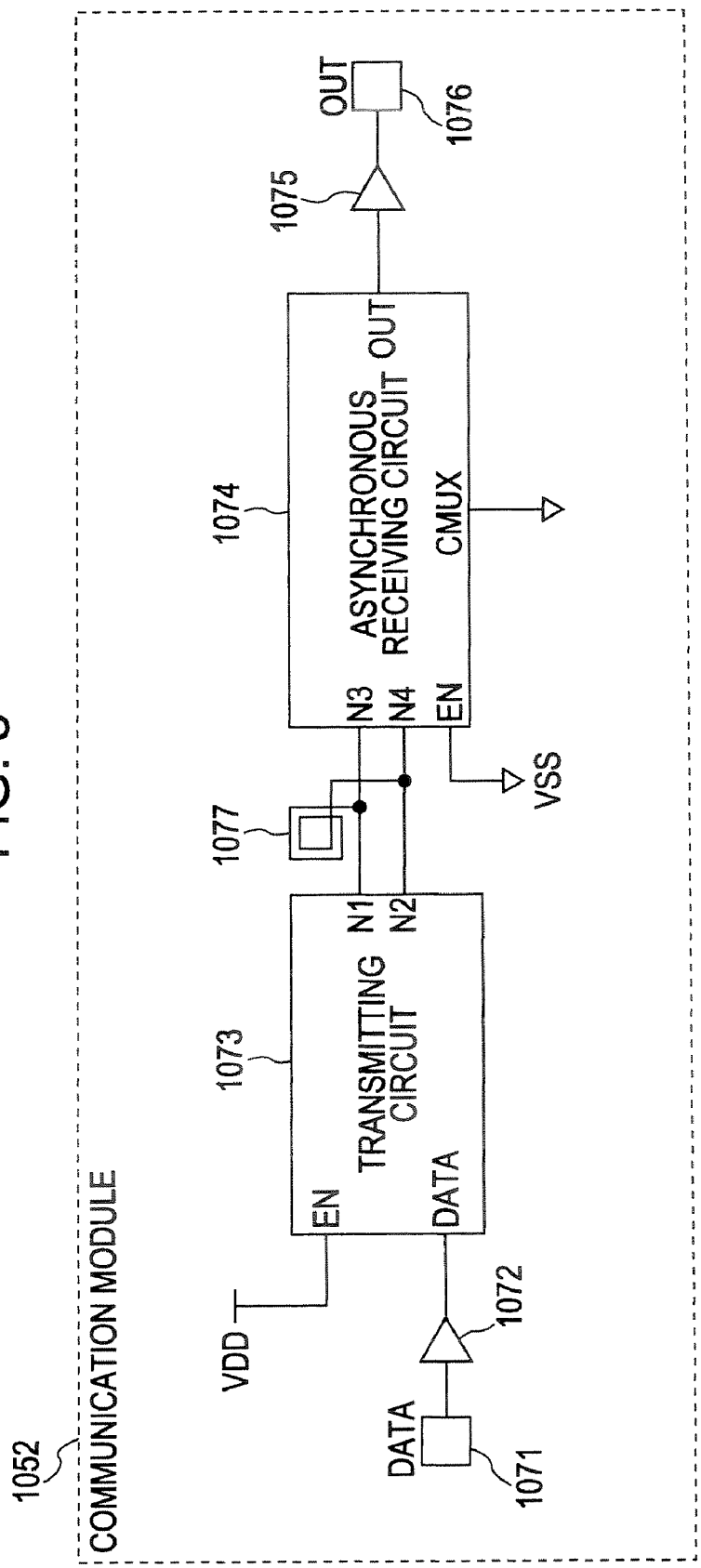
FIG. 8 is a block diagram showing a configuration of a communication module for transmission that performs asynchronous communication.

As shown in FIG. 8, the communication module 1052 generally includes a data terminal 1071, an amplifier 1072, the transmitting circuit 1073, the asynchronous receiving circuit 1074, an amplifier 1075, an output terminal 1076, and the antenna 1077. The data terminal (DATA) 1071 supplies an input data signal to the amplifier 1072. The amplifier 1072 amplifies the signal fed from the data terminal 1071, and supplies the amplified signal to a data terminal (DATA) of the transmitting circuit 1073. Output terminals N1 and N2 of the transmitting circuit 1073 are connected to input terminals N3 and N4 of the asynchronous receiving circuit 1074, respectively. The antenna 1077 is connected between the output terminals N1 and N2 and the input terminals N3 and N4. The signal is received by the input terminals N3 and N4 of the asynchronous receiving circuit 1074, and is output from an output terminal OUT of the asynchronous receiving circuit 1074. The amplifier 1075 amplifies the output signal. The amplified signal is then output from the output terminal (OUT) 1076.

The transmitting circuit 1073 has an enable terminal EN. The transmitting circuit 1073 is enabled when a high reference voltage VDD is supplied to the enable terminal EN, whereas the transmitting circuit 1073 is disabled when a low reference voltage VSS is supplied to the enable terminal EN. Likewise, the asynchronous receiving circuit 1074 is enabled when a high reference voltage VDD is supplied to an enable terminal EN, whereas the asynchronous receiving circuit 1074 is disabled when a low reference voltage VSS is supplied to the enable terminal EN. FIG. 8 shows a configuration of a communication module used for transmission. Thus, the transmitting circuit 1073 is enabled, and the asynchronous receiving circuit 1074 is disabled.

In this case, the signal received by the data terminal 1071 is amplified by the amplifier 1072 and fed to the transmitting circuit 1073. The transmitting circuit 1073 outputs, after performing wave-shaping on the fed signal, the wave-shaped signal from the antenna 1077.

Figure 9:
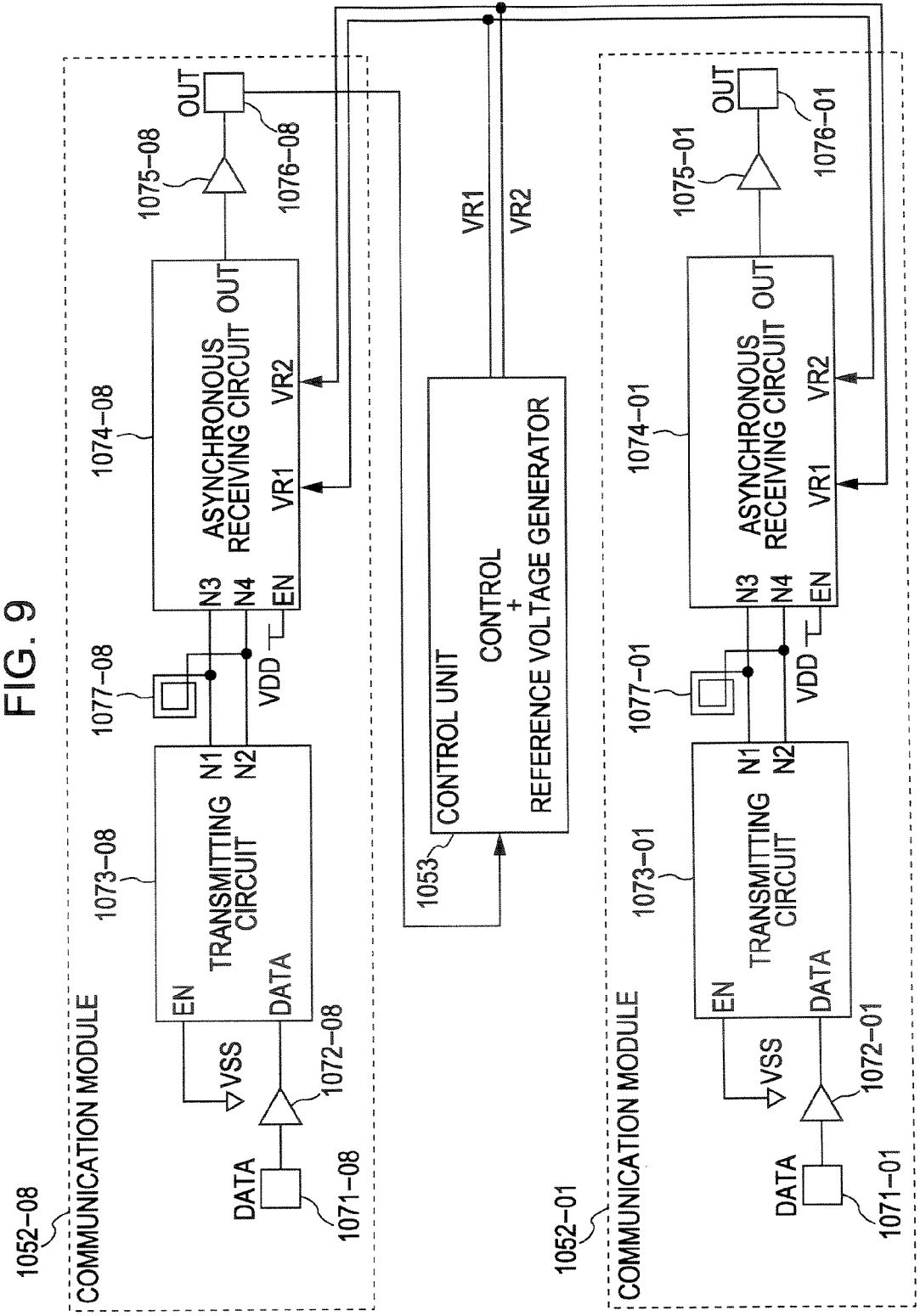
FIG. 9 is a block diagram showing a configuration of a communication module for reception that performs asynchronous communication.

FIG. 9 shows configurations of communication modules in the communication chip 1015 used for reception. It should be noted that, in FIG. 9 (also in FIG. 17 described below), numerals following hyphenated numerals denote the communication modules mounted at the positions represented by numerals 01 to 15 in FIG. 6 (also in FIG. 14). In this embodiment, configurations of the communication module 1052-08 mounted at the center, i.e., the position denoted by numeral 08, in FIG. 6 and the communication module 1052-01 mounted at the position denoted by numeral 01 are shown. The enable terminals EN of transmitting circuits 1073-08 and 1073-01 of these communication modules are supplied with the low reference voltage VSS. Accordingly, the transmitting circuits 1073-08 and 1073-01 are disabled.

On the other hand, since the enable terminal EN of the asynchronous receiving circuit 1074-08 of the communication module 1052-08 is supplied with the high reference voltage VDD, the asynchronous receiving circuit 1074-08 is enabled. Accordingly, the input terminals N3 and N4 of the asynchronous receiving circuit 1074-08 is supplied with the signals received by the antenna 1077-08. The output terminal OUT of the asynchronous receiving circuit 1074-08 then outputs the signal to the amplifier 1075-08. The amplifier 1075-08 amplifies the fed signal and the amplified signal is output from the output terminal 1076-08.

Similarly, since the enable terminal EN of the asynchronous receiving circuit 1074-01 of the communication module 1052-01 mounted at the position 01 is supplied with the high reference voltage VDD, the asynchronous receiving circuit 1074-01 is enabled. Accordingly, the input terminals N3 and N4 of the asynchronous receiving circuit 1074-01 is supplied with the signals received by the antenna 1077-01. The output terminal OUT of the asynchronous receiving circuit 1074-01 then outputs the signal to the amplifier 1075-01. The amplifier 1075-01 amplifies the fed signal and the amplified signal is output from the output terminal 1076-01.

The signal output from the output terminal 1076-08 is supplied to the control unit 1053. The control unit 1053 supplies reference voltages VR1 and VR2 to the asynchronous receiving circuits 1074-08 and 1074-01. As described below with reference to FIG. 12, the asynchronous receiving circuits 1074-08 and 1074-01 detect a positive pulse or a negative pulse using the reference voltages VR1 and VR2 as thresholds.

Figure 10:
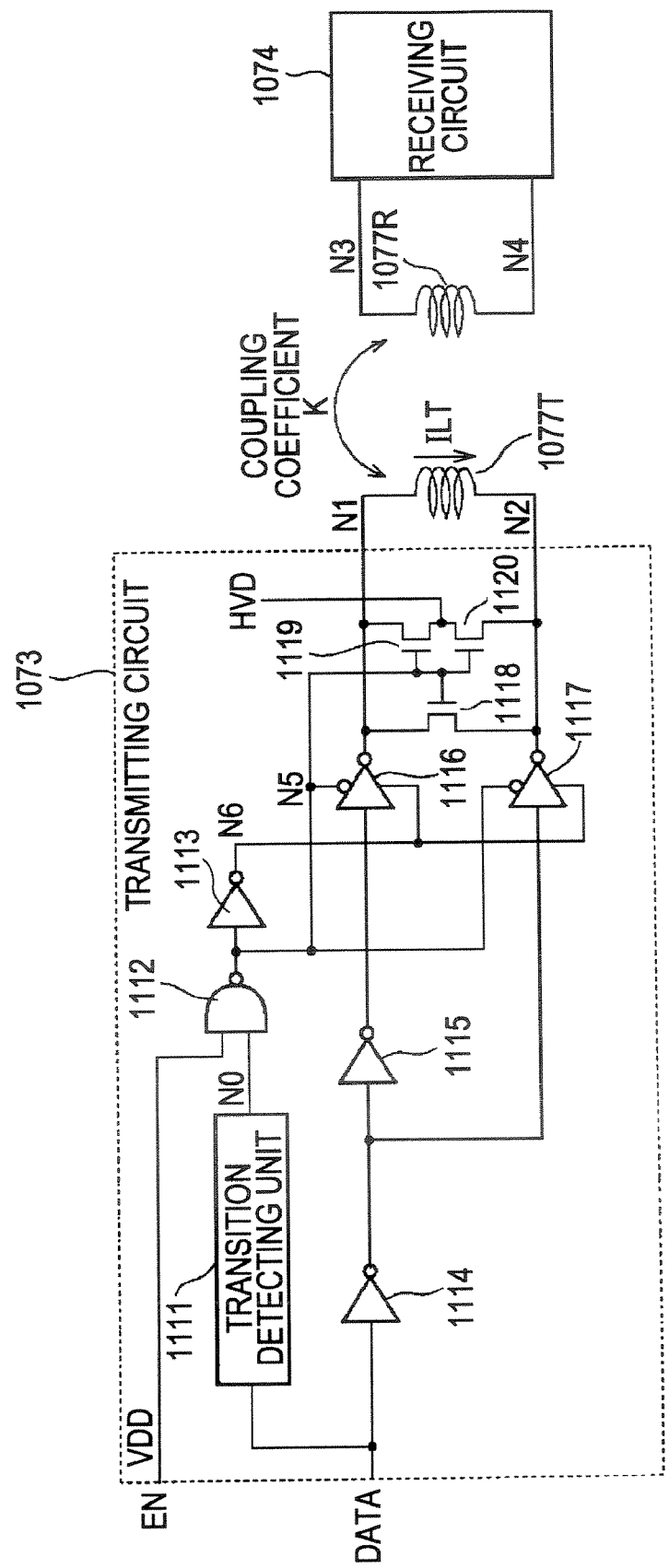
FIG. 10 is a circuit diagram showing a configuration of a transmitting circuit that performs asynchronous communication.

FIG. 10 shows a more detailed configuration of the transmitting circuit 1073. A transition detecting unit 1111 detects transition of the signal supplied to the data terminal DATA of the transmitting circuit 1073. Upon detecting the transition of the signal, the transition detecting unit 1111 generates a positive pulse, and outputs the positive pulse to a node N0. The positive pulse supplied to the node N0 is then fed to an input terminal of a NAND circuit 1112. The high reference voltage VDD, which is fed from the enable terminal EN, is supplied to the other input terminal of the NAND circuit 1112. An output terminal of the NAND circuit 1112 is connected to a node N5, which is further connected to one of control electrodes of each tristate buffer 1116 or 1117. An inverted output signal (i.e., the output signal of a node N6), which is obtained by inverting the output signal from the NAND circuit 1112 by an inverter 1113, is supplied to the other control electrode of each tristate buffer 1116 or 1117.

The tristate buffer 1116 is also supplied with the signal fed from the data terminal DATA through inverters 1114 and 1115. The tristate buffer 1117 is supplied with the output signal from the inverter 1114. The output signals from the tristate buffers 1116 and 1117 are supplied to both ends of the antenna 1077T on the transmission side through the output terminals N1 and N2. The output terminals N1 and N2 are connected to a transistor 1118, and to transistors 1119 and 1120 that are serially connected. A control electrode of each transistor 1118, 1119, or 1120 is connected to the node N5. A reference voltage HVD is supplied to a contact point of the transistors 1119 and 1120. The reference voltage HVD may be set at, for example, a half of the high reference voltage VDD.

For example, if a signal shown in FIG. 11A is fed to the data terminal DATA, the transition detecting unit 1111 detects a rising edge and a falling edge of the signal, and outputs the positive pulse to the node N0 as shown in FIG. 11B. The positive pulse supplied to the node N0 is inverted by the NAND circuit 1112, and is output to the node N5 as the negative pulse shown in FIG. 11C. In addition, the negative pulse supplied to the node N5 is then inverted by the inverter 1113, and is output to the node N6 as the positive pulse. Thus, when the negative and positive pulses are supplied to the nodes N5 and N6, respectively, the tristate buffers 1116 and 1117 are enabled. When the tristate buffers 1116 and 1117 are enabled, the signal is fed to the antenna 1077T through the inverters 1114 and 1115 and the inverter 1114. As a result, a current shown in FIG. 11D flows through the antenna 1077T. When the voltage at the node N5 becomes low, the transistors 1118 to 1120 are turned off, which allows the current to flow through the antenna 1077T. A direction of the current ILT that flows through the antenna 1077T changes inversely when the signal fed to the data terminal DATA is at the high level or the low level.

The antenna 1077 (e.g., the antenna 1077T of the transmitting circuit 1073 in FIG. 10) of the communication module 1052 for transmission and the antenna 1077 (e.g., the antenna 1077R of the asynchronous receiving circuit 1074 in FIG. 10) of the communication module 1052 for reception mounted at the corresponding positions are electromagnetically coupled at a coupling coefficient of K. Thus, if the current ILT flows through the antenna 1077T, the current also flows through the antenna 1077R, which generates a voltage at the input terminals N3 and N4 of the receiving circuit 1074 as shown in FIG. 11E. As shown in FIGS. 11D and 11E, the voltage shown by a solid line in FIG. 11E is generated in response to the rising edge of the current ILT that flows through the antenna 1077T, whereas the voltage shown by a broken line is generated in response to the falling edge of the current ILT.

Figure 12:
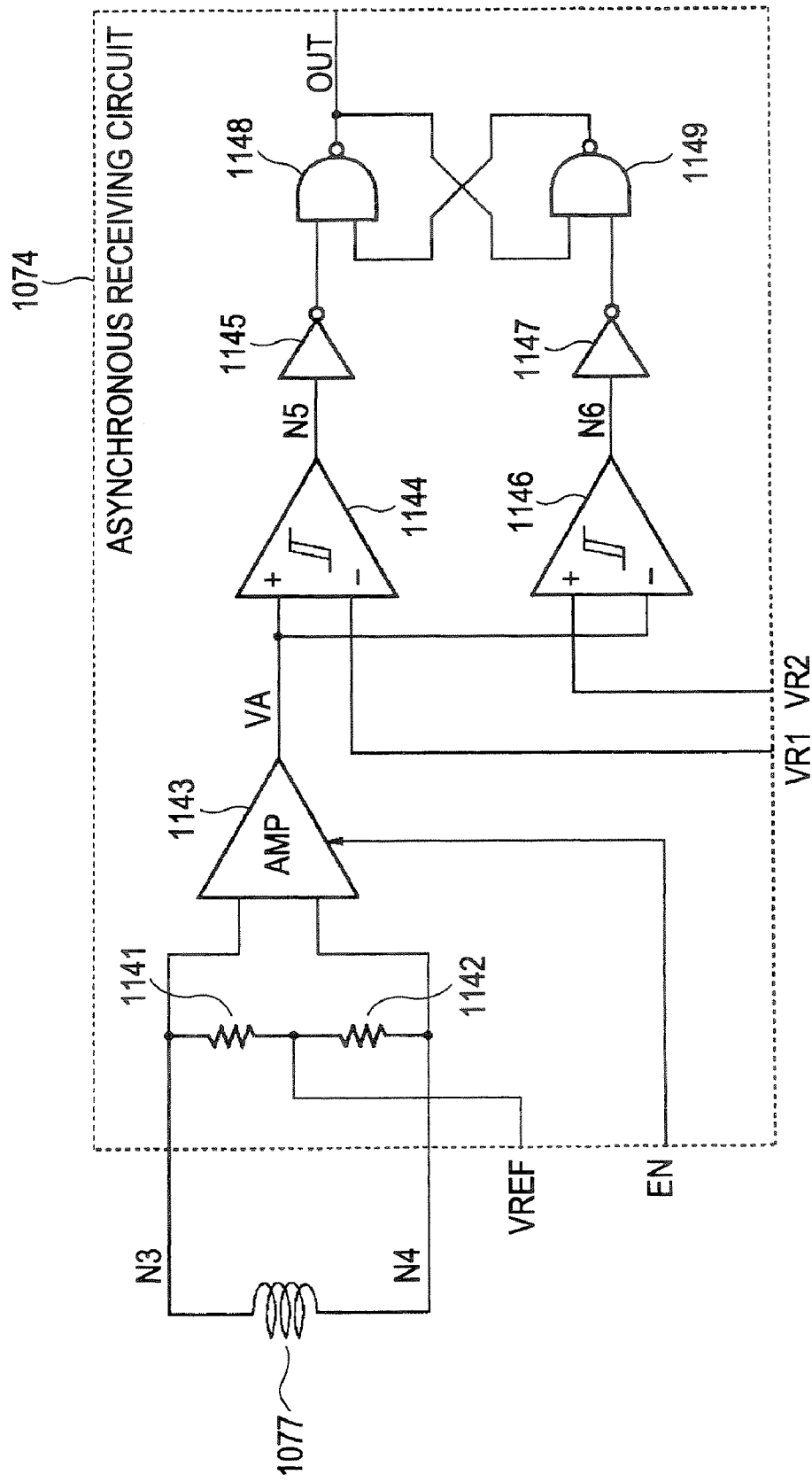
FIG. 12 is a circuit diagram showing a configuration of an asynchronous receiving circuit that performs asynchronous communication.

FIG. 12 shows a configuration of the asynchronous receiving circuit 1074. The input terminals N3 and N4 are connected to input terminals of the amplifier 1143. Resistors 1141 and 1142 are connected to the input terminals N3 and N4. The reference voltage VREF is supplied a contact point of the resistors 1141 and 1142. The output signal from the amplifier 1143 is supplied to a non-inverting input terminal of a hysteresis comparator 1144 and to an inverting input terminal of a hysteresis comparator 1146. An inverting input terminal of the hysteresis comparator 1144 is supplied with the reference voltage VR1, whereas a non-inverting input terminal of the hysteresis comparator 1146 is supplied with the reference voltage VR2.

An output terminal of the hysteresis comparator 1144 (i.e., the node N5) is connected to one of input terminals of a NAND circuit 1148, which constitutes a cross latch circuit together with a NAND circuit 1149, through an inverter 1145. An output terminal of the hysteresis comparator 1146 (i.e., the node N6) is connected to one of input terminals of the NAND circuit 1149 through an inverter 1147. An output terminal of the NAND circuit 1148 is connected to the other input terminal of the NAND circuit 1149. Similarly, an output terminal of the NAND circuit 1149 is connected to the other input terminal of the NAND circuit 1148.

Figure 13:
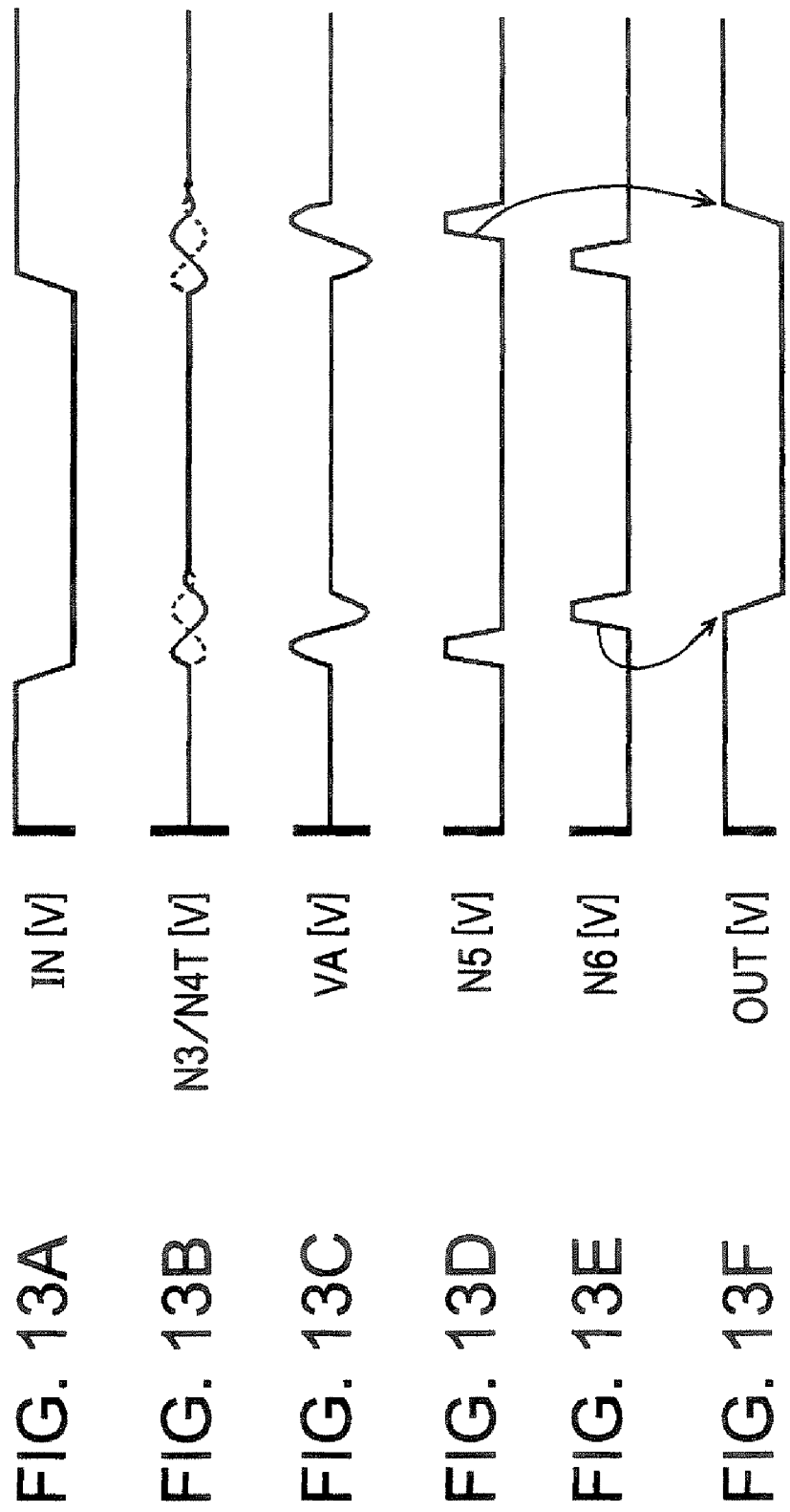
FIGS. 13A to 13F are wave-form charts illustrating an operation performed in an asynchronous receiving circuit shown in FIG. 12.

When the transmitting circuit 1073 of the communication module 1052 for transmission transmits an output signal ILT corresponding to the input signal IN shown in FIG. 13A, the voltage shown in FIG. 13B is generated at the antenna 1077 (i.e., the input terminals N3 and N4) of the communication module 1052 for reception by the electromagnetic induction. The amplifier 1143 amplifies the signal supplied from the antenna 1077 and outputs the amplified signal to a node VA as shown in FIG. 13C. The hysteresis comparator 1144 compares the level of the signal fed from the amplifier 1143 with that of the reference voltage VR1. When level of the supplied signal is higher than that of the reference voltage VR1, the hysteresis comparator 1144 outputs the positive pulse shown in FIG. 13D to the node N5. Likewise, the hysteresis comparator 1146 compares the level of the signal fed from the amplifier 1143 with that of the reference voltage VR2. When the level of the supplied signal is lower than that of the reference voltage VR2, the hysteresis comparator 1146 outputs the positive pulse shown in FIG. 13E to the node N6. The output signals supplied to the nodes N5 and N6 are inverted by the inverters 1145 and 1147, respectively. The signals are then latched and output by the cross latch circuit that inverts the signals whenever the negative pulse is supplied to the cross latch circuit as shown in FIG. 13F.

A communication chip 1015 that performs communication in synchronization with a clock signal has a configuration shown in FIG. 14. Although the communication chip 1015 generally has the same configuration as that shown in FIG. 6, in an embodiment shown in FIG. 14, the communication chip 1015 also includes a DLL (Delay Locked Loop) circuit 1161. At least one of communication modules 1052 mounted at the positions denoted by numerals 01 to 15 may be configured to perform asynchronous communication and the rest may be configured to perform synchronous communication. For example, the communication module 1052 mounted at the center position denoted by numeral 08 may be configured to perform the asynchronous communication and the rest of the communication modules 1052 mounted at the positions denoted by numerals 01 to 07 and 09 to 15 may be configured to perform the synchronous communication.

Figure 15:
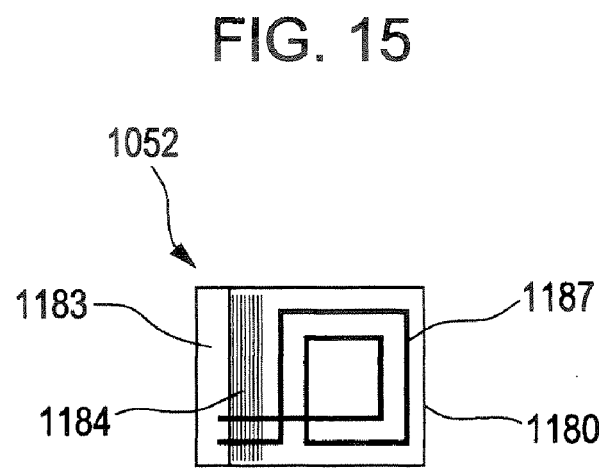
FIG. 15 is a plan view showing a configuration of a communication module shown in FIG. 14.

FIG. 15 is a plan view showing a configuration of a communication module 1052 that performs the synchronous communication (e.g., one of the communication modules mounted at the positions denoted by numerals 01 to 07 and 09 to 15) among those shown in FIG. 14. As described above, the communication module that performs the asynchronous communication (e.g., the communication module mounted at the position denoted by numeral 08) has the configuration shown in FIG. 7. As shown in FIG. 15, the communication module 1052 that performs the synchronous communication includes a transmitting circuit 1183, a synchronous receiving circuit 1184, an antenna 1187, and a wiring 1180. The communication module 1052 used for the synchronous communication has the same configuration as that shown in FIG. 7 except that the asynchronous receiving circuit 1074 is replaced by the synchronous receiving circuit 1184.

Figure 16:
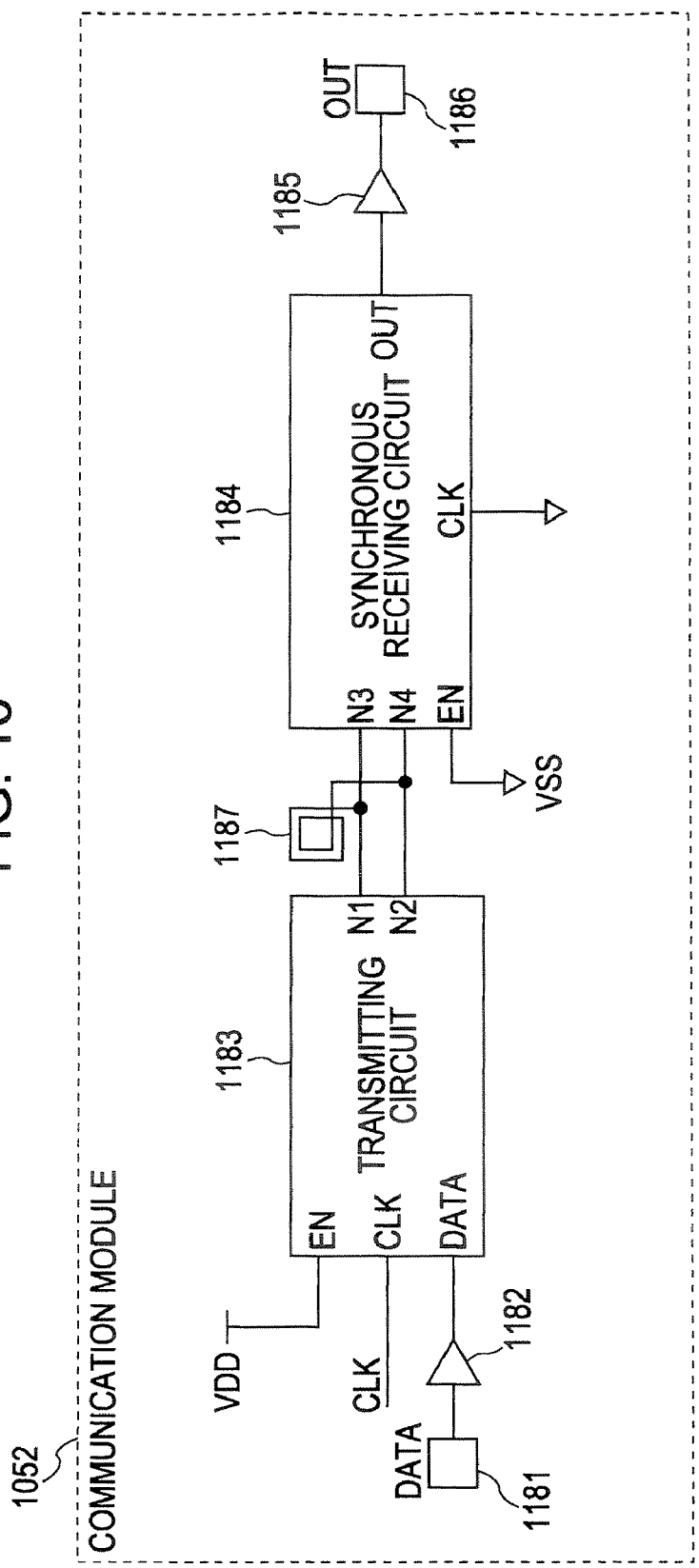
FIG. 16 is a block diagram showing a configuration of a communication module for transmission that operates in synchronization with a clock signal.

As shown in FIG. 16, the communication module 1052 that performs the synchronous communication includes, for example, a data terminal 1181, an amplifier 1182, the transmitting circuit 1183, the synchronous receiving circuit 1184, an amplifier 1185, an output terminal 1186, and the antenna 1187. As described above, the communication module 1052 that performs the asynchronous communication mounted at the position denoted by numeral 08 has the configuration shown in FIG. 8. The communication module 1052 shown in FIG. 16 generally has the same configuration as the communication module 1052, shown in FIG. 8, that performs the asynchronous communication. However, the transmitting circuit 1183 and the synchronous receiving circuit 1184 have clock terminals and operate in synchronization with supplied clock signals. The other configuration is the same as that shown in FIG. 8.

Since FIG. 16 shows an embodiment of the communication module for transmission, a low reference voltage VSS is supplied to an enable terminal EN of the synchronous receiving circuit 1184. Thus, the synchronous receiving circuit 1184 is disabled. On the other hand, since a high reference voltage VDD is supplied to an enable terminal EN of the transmitting circuit 1183, the transmitting circuit 1183 is enabled.

Figure 17:
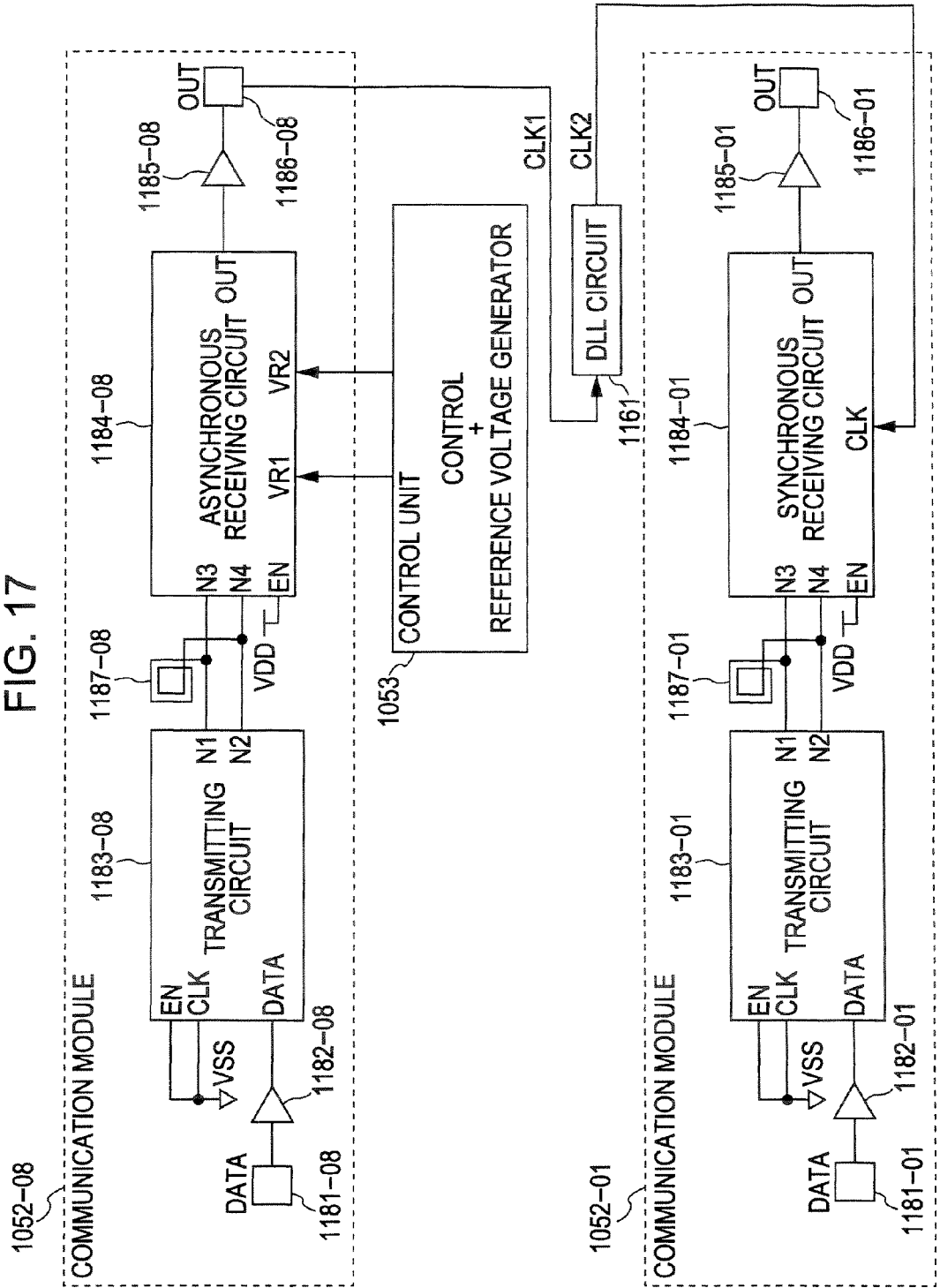
FIG. 17 is a block diagram showing a configuration of a communication module for reception that operates in synchronization with a clock signal.

FIG. 17 shows a basic connection relationship between a communication module 1052-08 mounted at the position denoted by numeral 08 and a communication module 1052-

01 mounted at the position denoted by numeral 01 among the communication modules 1052 of the communication chip 1015 for reception that performs the synchronous communication. The low reference voltage VSS is supplied to the enable terminals of the transmitting circuits 1183-08 and 1183-01 of the communication modules 1052-08 and 1052-01, respectively. Thus, each of the transmitting circuits 1183-08 and 1183-01 is disabled. On the other hand, the high reference voltage VDD is supplied to the enable terminals of the asynchronous receiving circuit 1184-08 and the synchronous receiving circuit 1184-01. Thus, the asynchronous receiving circuit 1184-08 and the synchronous receiving circuit 1184-01 are enabled.

Accordingly, the signal received by the antenna 1187-08 is fed to the amplifier 1185-08 through the asynchronous receiving circuit 1184-08. The signal is amplified by the amplifier 1185-08 and supplied to the DLL circuit 1161 from the output terminal 1186-08. More specifically, a clock signal is output from the transmitting circuit 1183-08 of the communication module 1052-08 for transmission mounted at the position denoted by numeral 08 and is transmitted by the antenna 1187-08. The transmitted signal is received by the antenna 1187-08 of the communication module 1052-08 for reception mounted at the position denoted by numeral 08, and is output from the output terminal 1186-08 as the clock signal after being processed by the asynchronous receiving circuit 1184-08 and the amplifier 1185-08.

The DLL circuit 1161 delays (adjusts the phase of) the clock signal CLK1 output from the output terminal 1186-08 by a predetermined time period, and outputs the delayed clock signal to the synchronous receiving circuit 1184-01 as a clock signal CLK2. Although the illustration is omitted in FIG. 17, the clock signal CLK2 is also supplied to the synchronous receiving circuits 1184-02 to 1184-07 and 1184-09 to 1184-15 for reception mounted at other positions. The synchronous receiving circuit 1184-01 operates in synchronization with the supplied clock signal CLK2. More specifically, a signal received by the antenna 1187-01 is supplied to the synchronous receiving circuit 1184-01 in synchronization with the clock signal CLK2. The signal is, after being amplified by the amplifier 1185-01, output from the output terminal 1186-01.

In addition, the control unit 1053 supplies the reference voltages VR1 and VR2 to the asynchronous receiving circuit 1184-08 (which is configured in the same manner as the asynchronous receiving circuit 1074 shown in FIG. 12). The reference voltages VR1 and VR2 may be determined on the basis of experimental results or the like.

Figure 18:
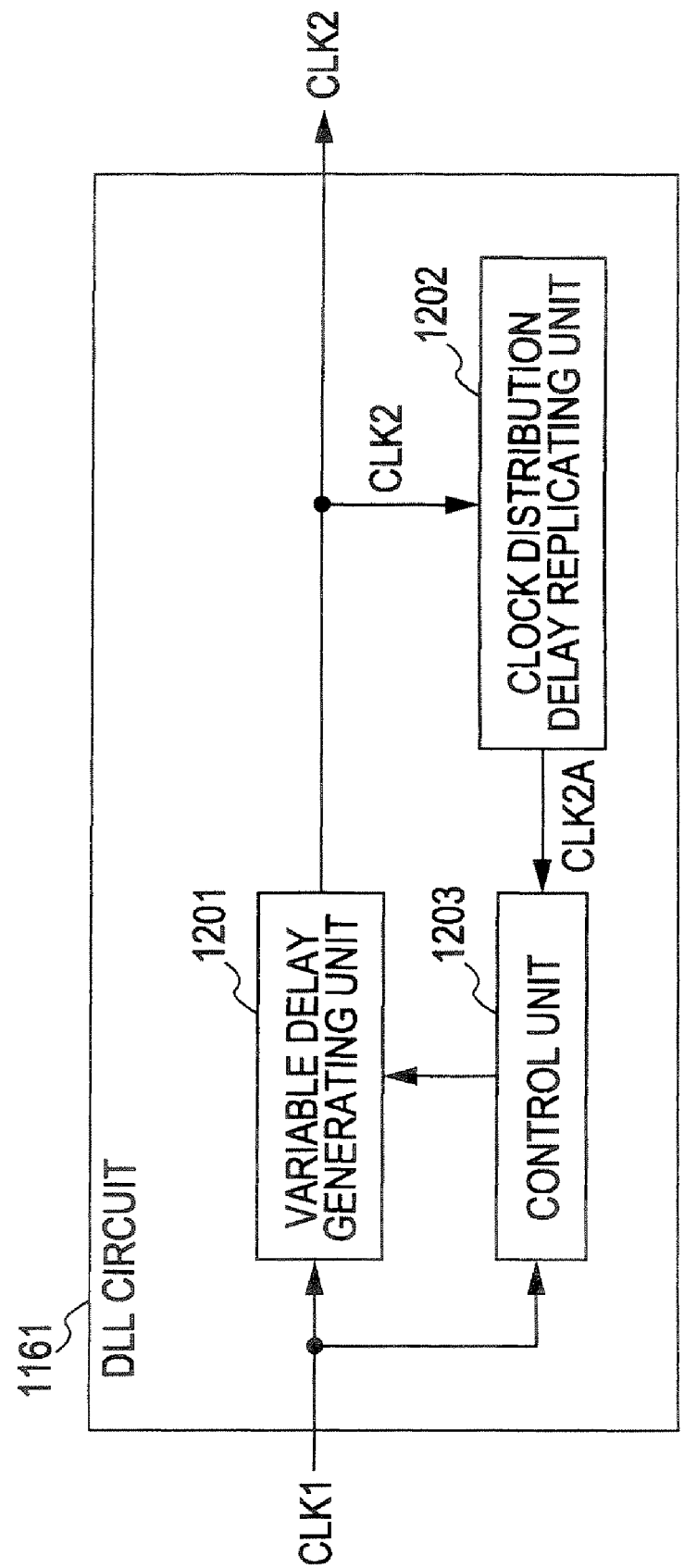
FIG. 18 is a block diagram showing a configuration of a DLL (Delay Locked Loop) circuit.

FIG. 18 shows a configuration of the DLL circuit 1161 that serves as an adjustment circuit. The DLL circuit 1161 includes a variable delay generating unit 1201, a clock distribution delay replicating unit 1202, and a control unit 1203. The variable delay generating unit 1201 delays the fed clock signal CLK1 by a predetermined delay time Ta, and outputs the clock signal CLK2. The clock signal CLK2 is delayed by the clock distribution delay replicating unit 1202 by a delay time Tb, and output as a clock signal CLK2A. The control unit 1203 adjusts the delay time Ta used by the variable delay generating unit 1201 so as to eliminate a phase difference between the clock signal CLK2A and the clock signal CLK1. More specifically, the control unit 1203 increases the delay time Ta when the phase of the clock signal CLK2A is delayed relative to that of the clock signal CLK1, whereas the control unit 1203 decreases the delay time Ta when the phase of the clock signal CLK1 is delayed relative to that of the clock signal CLK2A.

Figure 19:
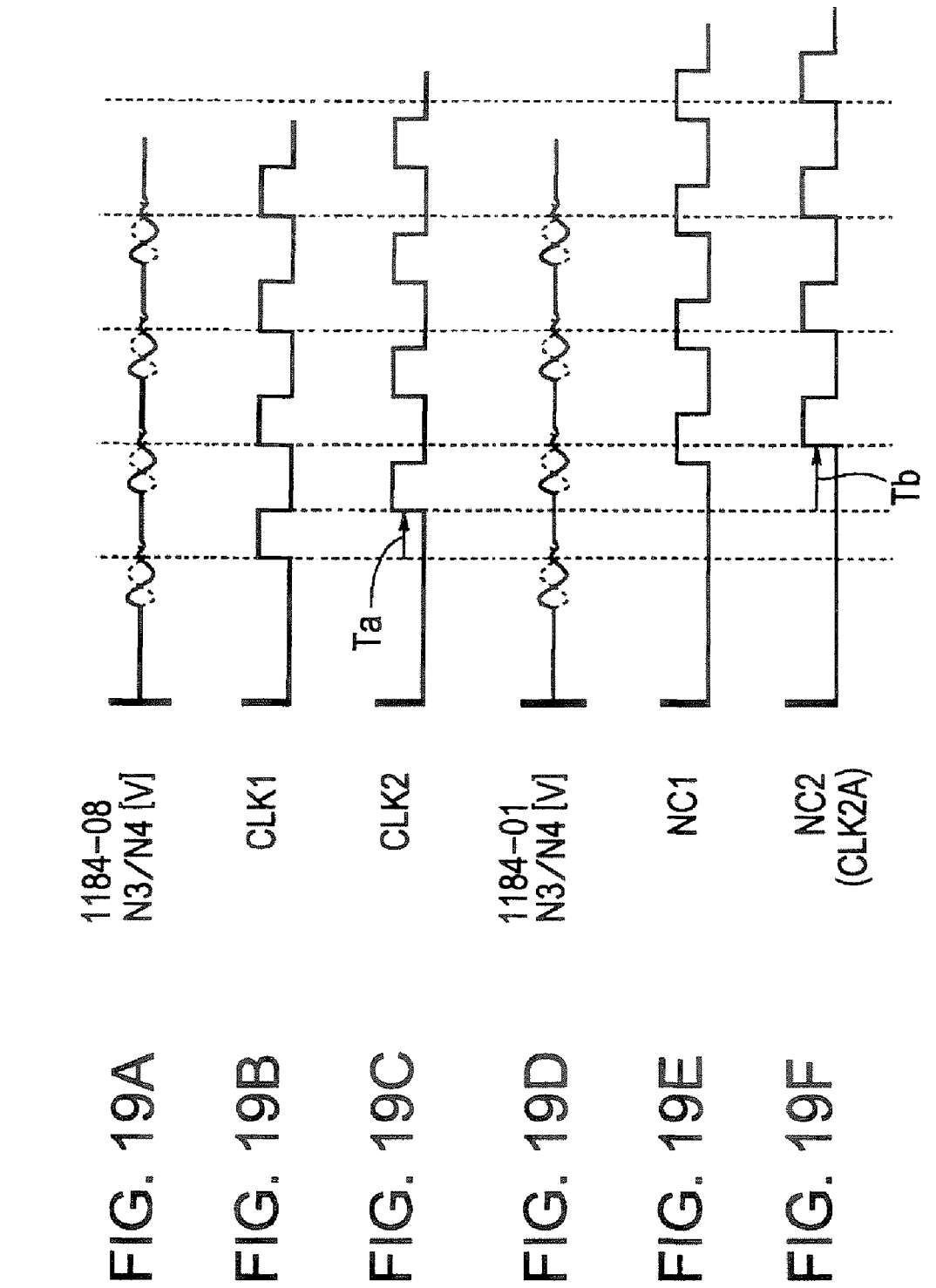
FIGS. 19A to 19F are wave-form charts illustrating an operation performed in a DLL circuit shown in FIG. 18.

More specifically, after the clock signal, shown in FIG. 19A, received by the antenna 1187-08, is supplied to the input terminals N3 and N4 of the asynchronous receiving circuit 1184-08 shown in FIG. 17, the signal is supplied to the DLL circuit 1161 as the clock signal CLK1 shown in FIG. 19B. The DLL circuit 1161 delays the clock signal CLK1 by the delay time Ta, and outputs the delayed signal as the clock signal CLK2 shown in FIG. 19C.

On the other hand, for example, when the signal, shown in FIG. 19D, received by the antenna 1187-01 is supplied to the input terminals N3 and N4 of the synchronous receiving circuit 1184-01, it is desired that the clock signal CLK2 has a timing suitable for processing the signal. That is, as described below with reference to FIG. 23, clocks each having predetermined timings, shown in FIGS. 19E and 19F, are desired at nodes NC1 and NC2 in the synchronous receiving circuit 1184-01. The clock distribution delay replicating unit 1202 delays the clock CLK2 by the delay time Tb and generates the clock CLK2A so as to adjust the timing. That is, suitable clock synchronization is performed by adjusting the phases of the clock CLK1 and the clock CLK2 so as to eliminate the phase difference therebetween.

Figure 20:
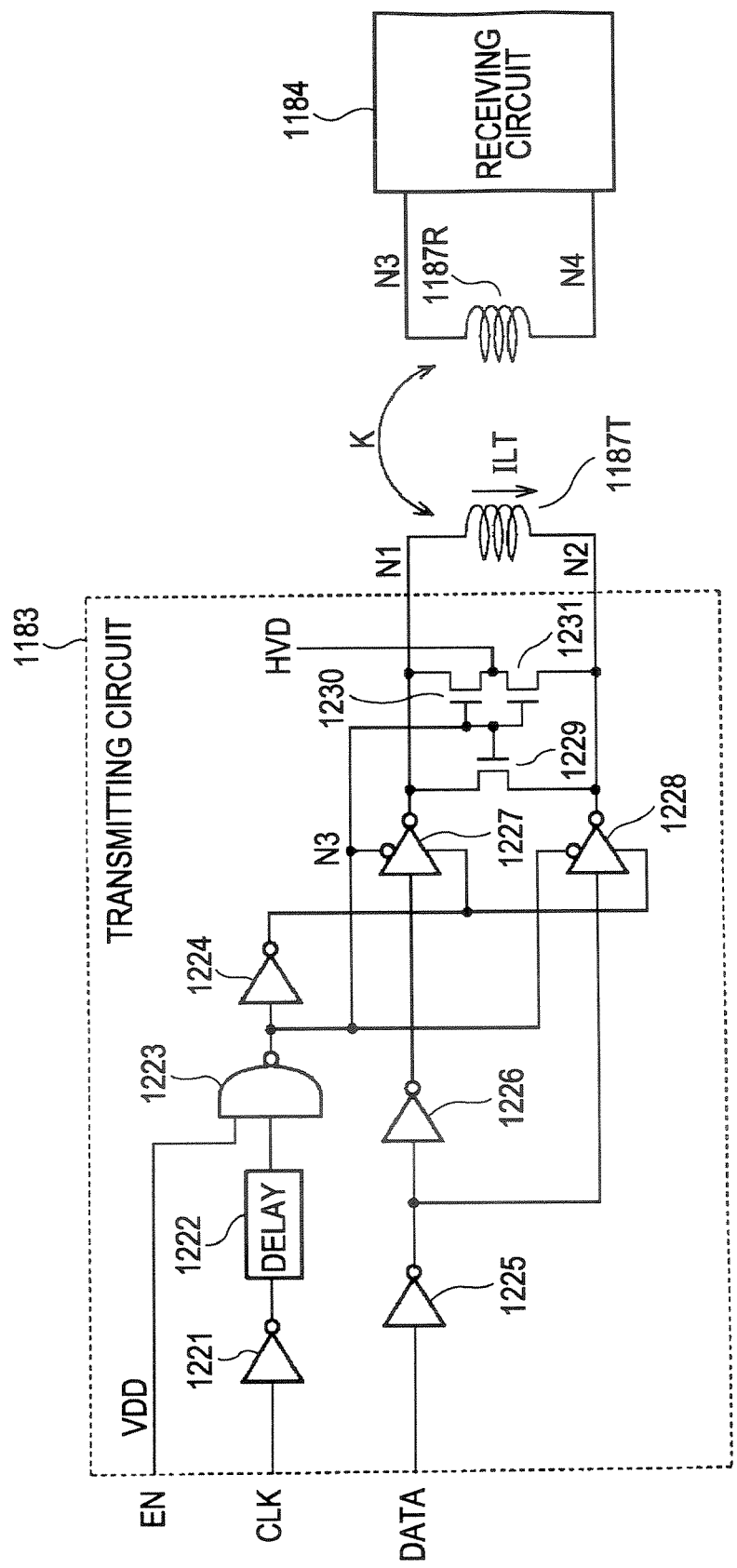
FIG. 20 is a circuit diagram showing a configuration of a transmitting circuit that operates in synchronization with a clock signal.

FIG. 20 shows a configuration of the transmitting circuit 1183 (shown in FIG. 16) that operates in synchronization with the clock signal. An inverter 1221, a delay circuit 1222, and a NAND circuit 1223 collectively detect a rising edge of the clock signal. The NAND circuit 1223, inverters 1224 to 1226, tristate buffers 1227 and 1228, transistors 1229 to 1231 generally have the same configurations as the NAND circuit 1112, the inverters 1113 to 1115, the tristate buffers 1116 and 1117, and transistors 1118 to 1120 shown in FIG. 10, respectively.

When a clock signal shown in FIG. 21A is fed to a clock terminal, the inverter 1221, the delay circuit 1222, and the NAND circuit 1223 detect the rising edge of the clock signal. The NAND circuit 1223 outputs a negative pulse shown in FIG. 21B, which is synchronized with the rising edge of the clock signal, from the output terminal (i.e., a node N3) thereof. The inverter 1224, in turn, outputs the positive pulse. The tristate buffers 1227 and 1228 are enabled while the negative pulse is output to the node N3, and the input data signal shown in FIG. 21C is supplied to the antenna 1187T, which causes a current ILT shown in FIG. 21D to flow through the antenna 1187T. The antenna 1187R on a receiving side is electromagnetically coupled to the antenna 1187T at a coupling coefficient of K. The electromagnetic induction between the antennas 1187R and 1187T causes the current to flow through the antenna 1187R, which generates a voltage, shown in FIG. 21E, at the input terminals N3 and N4 of the receiving circuit 1184.

Figure 22:
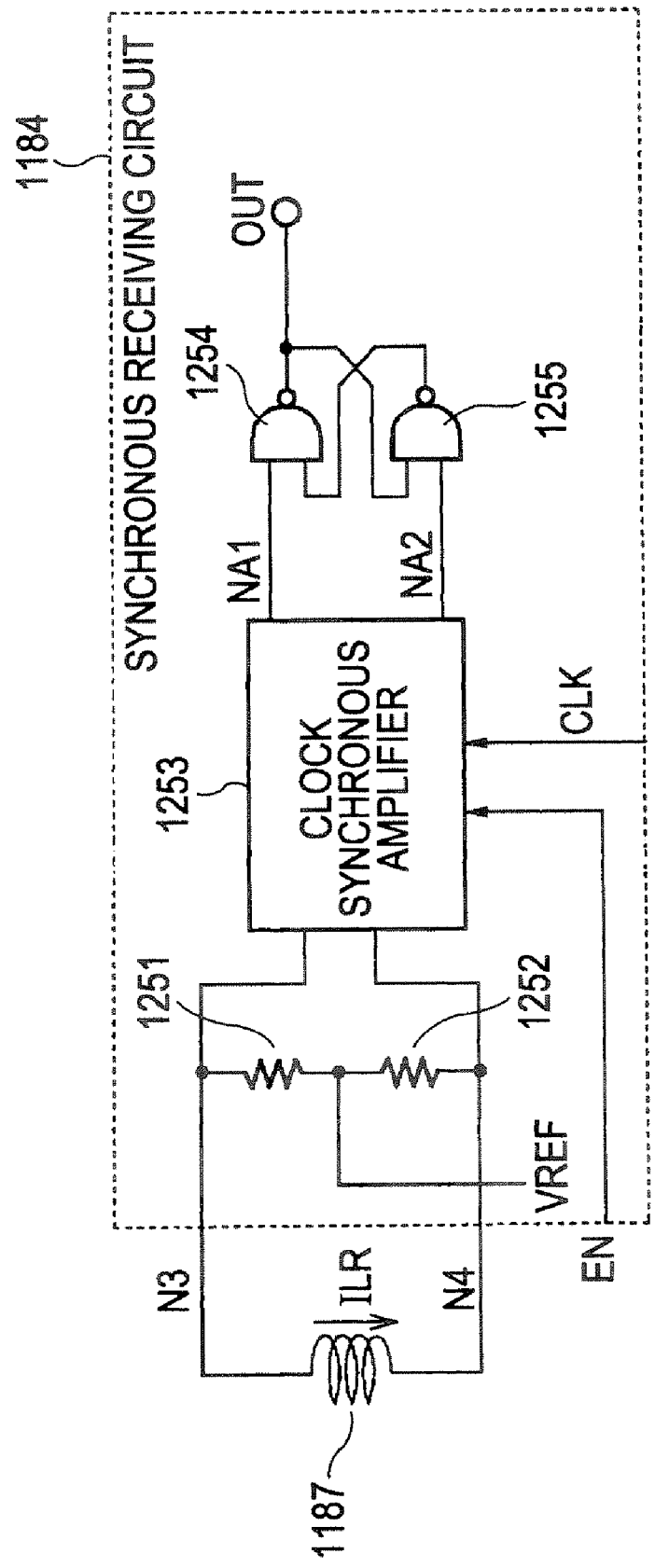
FIG. 22 is a circuit diagram showing a configuration of a synchronous receiving circuit that operates in synchronization with a clock signal.

FIG. 22 shows a configuration of the synchronous receiving circuit 1184 (shown in FIG. 17). As shown in FIG. 22, the input terminals N3 and N4 of the antenna 1187 are connected to input terminals of a clock synchronous amplifier 1253. Resistors 1251 and 1252 are connected to the input terminals N3 and N4. The reference voltage VREF is supplied to a contact point of the resistors 1251 and 1252. Output terminals NA1 and NA2 of the clock synchronous amplifier 1253 are connected to a cross latch circuit, which is composed of NAND circuits 1254 and 1255.

A signal fed from the antenna 1187 is amplified in synchronization with the clock signal by the clock synchronous amplifier 1253, and is latched by the cross latch circuit composed of the NAND circuits 1254 and 1255.

Figure 23:
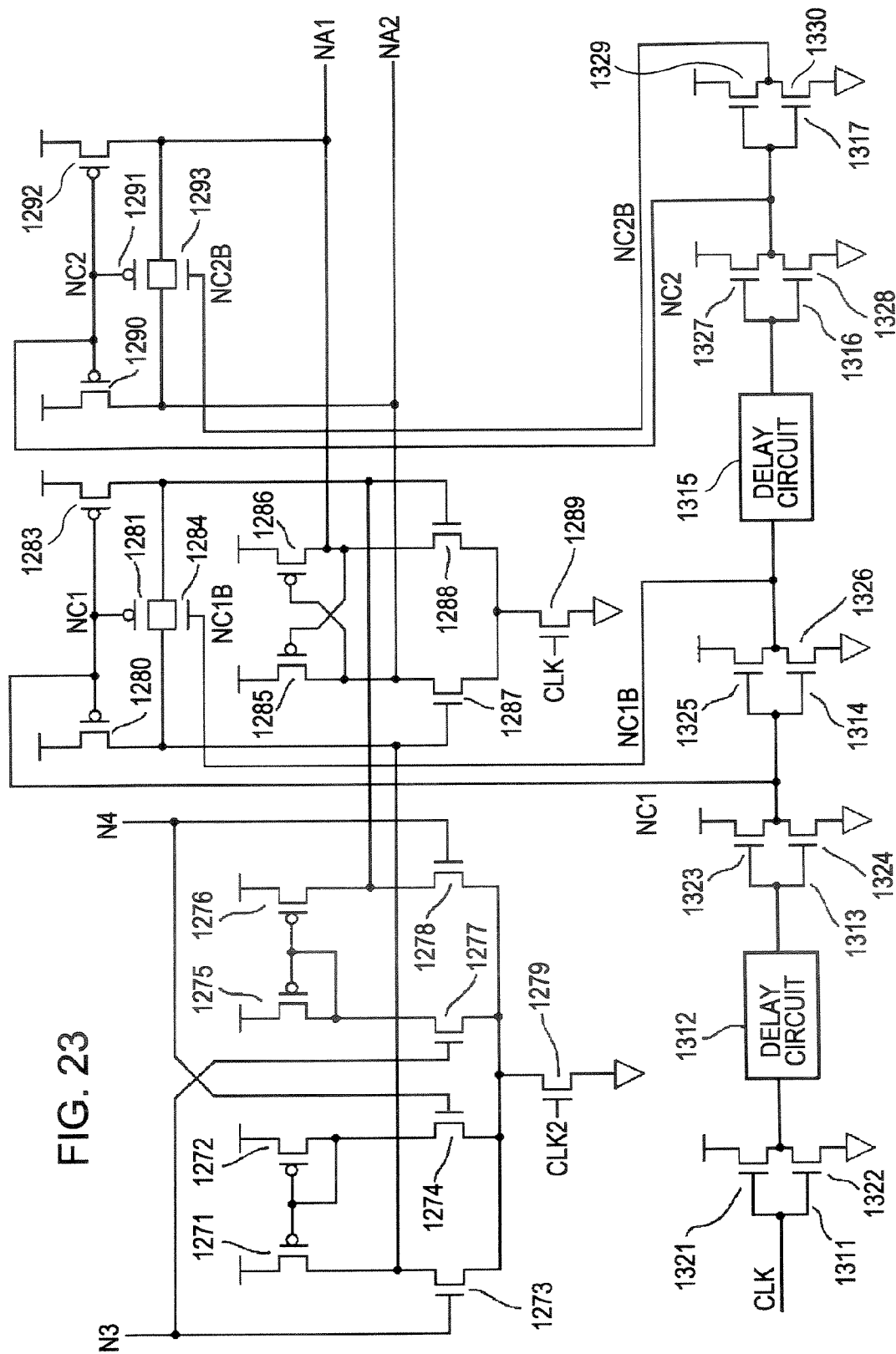
FIG. 23 is a circuit diagram showing a configuration of a clock synchronous amplifier shown in FIG. 22.

The clock synchronous amplifier 1253 may have the configuration, for example, shown in FIG. 23. As shown in FIG. 23, in the clock synchronous amplifier 1253, gates of transistors 1271 and 1272 are connected to each other. Sources of the transistors 1271 and 1272 are connected to drains of the transistors 1273 and 1274, respectively. A common node of sources of the transistors 1273 and 1274 is further connected to a drain of a transistor 1279. The gate and the source of the transistor 1272 are connected. Gates of transistors 1275 and 1276 are connected each other. The gate and a source of the transistor 1275 are connected. Sources of the transistors 1275 and 1276 are connected to drains of transistors 1277 and 1278, respectively. A common node of sources of the transistors 1277 and 1278 is connected to the drain of the transistor 1279.

Gates of the transistors 1273 and 1277 are connected to the input terminal N3, whereas gates of the transistors 1274 and 1278 are connected to the input terminal N4.

Gates of transistors 1280, 1281, and 1283 are connected to the node NC1. A source of the transistor 1280 is connected to a gate of a transistor 1287 and to the drain of the transistor 1273. The source of the transistor 1280 is also connected to sources of the transistors 1281 and 1284. A source of the transistor 1283 is connected to drains of the transistors 1281 and 1284 and to the source of the transistor 1276. In addition, the source of the transistor 1283 is also connected to a gate of a transistor 1288. A gate of the transistor 1284 is connected to a node NC1B.

A source of a transistor 1285 is connected to a drain of the transistor 1287 and to a gate of a transistor 1286. A source of the transistor 1286 is connected to a gate of the transistor 1285 and to a drain of the transistor 1288. The sources of the transistors 1287 and 1288 are connected to each other, and a node thereof is connected to a drain of a transistor 1289.

Gates of transistors 1290, 1291, and 1292 are connected to the node NC2. A source of the transistor 1290 is connected to sources of the transistors 1291 and 1293, and to the drain of the transistor 1287. A source of the transistor 1292 is connected to drains of the transistors 1291 and 1293, and to the source of the transistor 1286. The source of the transistor 1290 and the drain of the transistor 1287 are connected to a terminal NA2. The source of the transistor 1292 and the drain of the transistor 1288 are connected to a terminal NA1.

the clock signal CLK2 output by the clock distribution delay replicating unit 1202 shown in FIG. 18 is supplied to the gates of the transistors 1279 and 1289. In addition, the clock signal CLK2 is, after being inverted by an inverter 1311, delayed by a delay circuit 1312. The clock delayed by the delay circuit 1312 is inverted again by an inverter 1313, and output to the node NC1. The clock, after being inverted by an inverter 1314, is output to the node NC1B. The clock supplied to the node NC1B is further delayed by a delay circuit 1315, and the delayed clock is, after being inverted by an inverter 1316, output to the node NC2. The clock further inverted by an inverter 1317 is then output to the node NC2B.

The inverter 1311 is composed of transistors 1321 and 1322. Similarly, the inverters 1313, 1314, 1316, and 1317 are composed of transistors 1323 and 1324, 1325 and 1326, 1327 and 1328, and 1329 and 1330, respectively.

A circuit at a first stage is composed of the transistors 1271 to 1279, whereas a circuit at a second stage is composed of the transistors 1280 to 1289. In addition, a circuit at a third stage is composed of the transistors 1290 to 1293. The clock utilized at the second stage (i.e., the clock supplied to the nodes NC1 and NC1B) is delayed relative to the clock signal CLK2 utilized at the first stage by the delay circuit 1312 by a predetermined time period. The clock utilized at the third stage (i.e., the clock supplied to the nodes NC2, and NC2B) is delayed relative to the clock utilized at the second stage by the delay circuit 1315 by a predetermined time period. The signal fed from the input terminals N3 and N4 is amplified at each stage, and output from the terminals NA1 and NA2.

Figure 24:
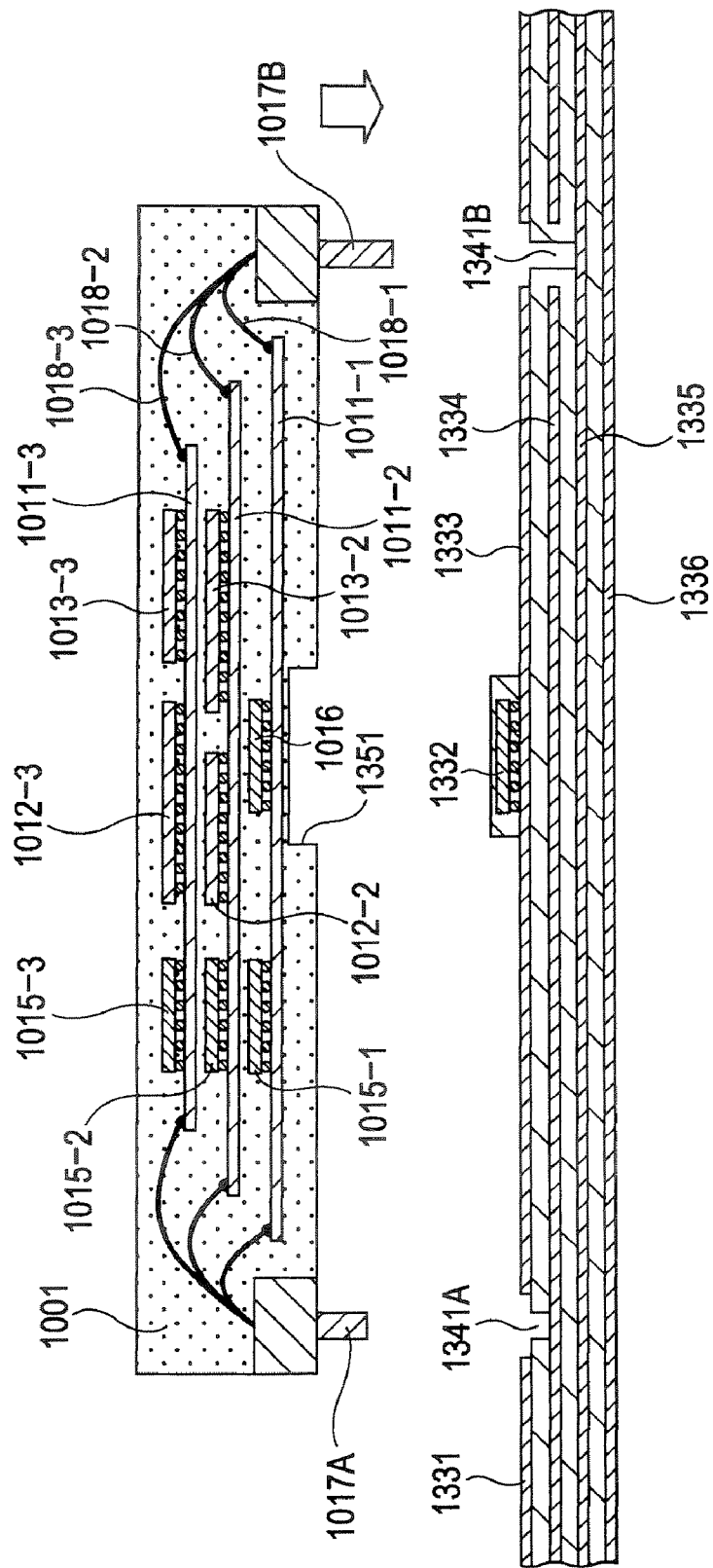
FIG. 24 is a sectional side view showing a configuration before a multi-chip package is mounted on a wiring board.
Figure 25:
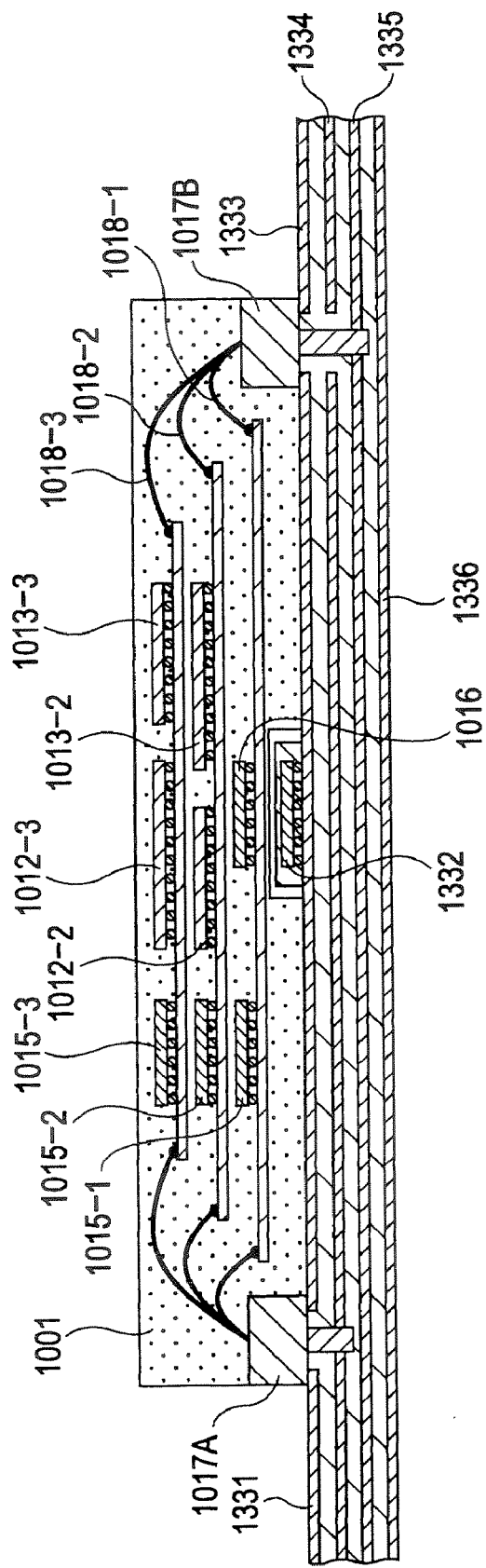
FIG. 25 is a sectional side view showing a configuration after a multi-chip package is mounted on a wiring board.

The multi-chip package 1001 having the above-described configuration may be mounted on an external board as shown in, for example, FIGS. 24 and 25. FIG. 24 shows a state before the multi-chip package 1001 is mounted on (or equipped with) a wiring board 1331. FIG. 25 shows a state after the multi-chip package 1001 is mounted on (or equipped with) the wiring board 1331.

As shown in FIGS. 24 and 25, a concave portion 1351 is formed at a position, corresponding to the position where a communication chip 1332 is mounted on the wiring board 1331, of the bottom surface of the multi-chip package 1001. When the multi-chip package 1001 is mounted on the wiring board 1331, the communication chip 1016 included in the multi-chip package 1001 and the communication chip 1332 mounted on the wiring board 1331 are mounted sufficiently close to each other and facing each other.

A power electrode 1017A, shown on the left in FIG. 24 or 25, is inserted into a through hole 1341A, and is connected to a second wiring 1334 from the top of the wiring board 1331. A power electrode 1017B, shown on the right in FIG. 24 or 25, is inserted into a through hole 1341B, and is connected to a third wiring 1335 from the top. The wiring board 1331 has metal wirings 1333 to 1336, from which electric power is supplied to each unit.

In FIGS. 1 and 3, the multi-chip package 1001 has a thin bottom of uniform thickness. In FIGS. 24 and 25, the concave portion 1351 is formed at the position, corresponding to the position where the communication chip 1332 is mounted on the wiring board 1331, i.e., an external board. The part where the concave portion 1351 is formed is configured to be thinner and the rest of the part is configured to be thicker. Thus, the inside of the multi-chip package 1001 can be protected more firmly.

Now, a description of a noise included in a signal received by the communication module 1052 shown in, for example, FIG. 6, is given.

A coil antenna of the communication module 1052-08 mounted on the communication chip 1015 for reception receives desired signals from a coil antenna of the communication module 1052-08 mounted on the corresponding communication chip 1015 for transmission. In addition to the desired signals, the coil antenna also receives undesired signals from other coil antennas (for example, signals transmitted from the communication modules 1052 mounted on the communication chip 1015 for transmission, which corresponds to other (surrounding) communication modules 1052 mounted on the communication chip 1015 for reception).

Figure 26:
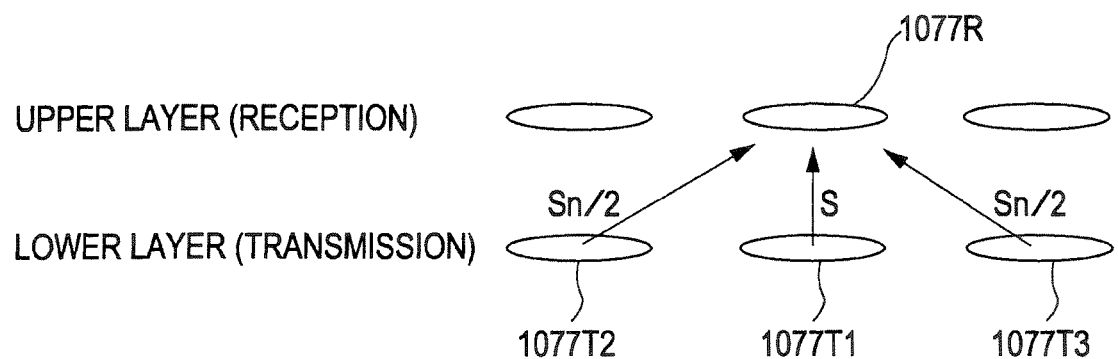
FIG. 26 illustrates an example of a transmission/reception operation of signals via an antenna.

More specifically, as shown in FIG. 26, a coil antenna 1077R of a communication module 1052 formed on a communication chip 1015 used for reception receives desired signals transmitted from a coil antenna 1077T1 of a communication module 1052, which corresponds to the communication module 1052 having the coil antenna 1077R, mounted on the communication chip 1015 used for transmission. In addition to the desired signals, the coil antenna 1077R also receives undesired signals from coil antennas 1077T2 and 1077T3 of communication modules 1052 mounted around the coil antenna 1077T1.

Thus, it is desired for the communication module 1052-08 (hereinafter, also referred to as a "receiving module 1052-08") formed on the communication chip 1015 used for reception to operate under the following conditions.

Firstly, when the communication module 1052-08 formed on the communication chip 1015 used for transmission (hereinafter, referred to as a "transmitting module 1052-08") does not transmit a signal, the output from the receiving module 1052-08 does not change (i.e., the receiving module 1052-08 does not detect any signals). That is, when some of or all of the transmitting modules 1052 other than the transmitting module 1052-08 simultaneously transmit signals under a condition that a maximum intensity of noise is applied to the receiving module 1052-08, the receiving module 1052-08 does not receive these signals.

Secondly, when the transmitting module 1052-08 transmits a signal, the receiving module 1052-08 accurately receives the transmitted signal and outputs the received signal (i.e., detects the transmitted signal). That is, when the transmitting module 1052-08 transmits a signal while some of or all of the transmitting modules 1052 other than the transmitting module 1052-08 transmit signals having opposite phases, i.e., under a condition that the maximum intensity of noise is applied to the receiving module 1052-08, the receiving module 1052-08 accurately receives the signal transmitted from the transmitting module 1052-08.

Now, suppose that total intensity of signals (i.e., total intensity of adjacent interference), which the coil antenna 1077 of the receiving module 1052-08 receives when at least some of the transmitting modules 1052 other than the transmitting module 1052-08 (i.e., the transmitting modules 1052-01 to 1052-07 and 1052-09 to 1052-15) transmit signals under the condition that the maximum intensity of noise is applied to the receiving module 1052-08, is denoted by Sn. In addition, suppose that intensity of signals (i.e., intensity of communication signals), which the coil antenna 1077 of the receiving module 1052-08 receives when the transmitting module 1052-08 corresponding to the receiving module 1052-08 transmits the signal, is denoted by S.

According to the above-described conditions, the receiving module 1052-08 does not receive signals when the intensity of communication signals S is equal to or lower than the total intensity of adjacent interference Sn. Accordingly, the intensity of communication signals S has to be greater than the total intensity of adjacent interference Sn (i.e., S>Sn).

For example, in an example shown in FIG. 26, the intensity of the communication signals that the coil antenna 1077R receives from the coil antenna 1077T1 has to be greater than the sum (i.e., the total intensity of the adjacent interference Sn) of intensity of signals (i.e., Sn/2) that the coil antenna 1077R receives from the coil antennas 1077T2 and 1077T3 mounted around the coil antenna 1077T1 (i.e., mounted at the positions not corresponding to the position of the coil antenna 1077R).

In addition, as described above, the receiving module 1052-08 has to be capable of receiving the signal transmitted from the transmitting module 1052-08 even while receiving the signals, having a phase opposite to that of the signal transmitted from the transmitting module 1052-08, transmitted from other transmitting modules 1052. Thus, the condition of S>2Sn has to be satisfied.

The intensity of communication signals S and the total intensity of adjacent interference Sn vary depending on a distance between communication chips and a diameter and a number of turns of a coil antenna. Thus, these parameters (e.g., the distance between communication chips, the diameter and the number of turns of a coil antenna) are determined in a designing process so that the above-described condition (i.e., S>2Sn) is satisfied.

The receiving module 1052-08 determines whether or not to receive signals using a predetermined threshold SRth in order to receive the communication signals only when the above-mentioned communication condition is satisfied. More specifically, the receiving module 1052-08 receives the communication signals when the intensity of communication signals S, the total intensity of adjacent interference Sn, and the threshold SRth satisfy the condition of (S−Sn)>SRth>Sn. The control unit 1053 (shown in, for example, FIG. 6) controls the values of the threshold SRth.

Now, an operation of the control unit 1053 performed when the asynchronous receiving circuit 1074 shown in FIG. 12 is used will be described.

For example, with a configuration shown in FIG. 5, a predetermined signal is continuously fed to some of or all of the transmitting modules 1052 except for the transmitting module 1052-08 mounted on the communication chip 1015-3 at the time of power-on so as to apply the adjacent interference signals having the intensity Sn to the receiving module 1052-08 formed on the communication chip 1015-2.

At this time, referring to FIG. 9, the control unit 1053 changes values of the reference voltages VR1 and VR2 supplied to the receiving module 1052-08 such that the threshold SRth used in the receiving module 1058-08 is gradually changed from a minimum value (i.e., the value set for the threshold SRth is gradually increased). The control unit 1053 then fixes (or sets) the value of the threshold SRth at a value indicated when the receiving module 1052-08 becomes incapable of receiving the communication signal.

Figure 27:
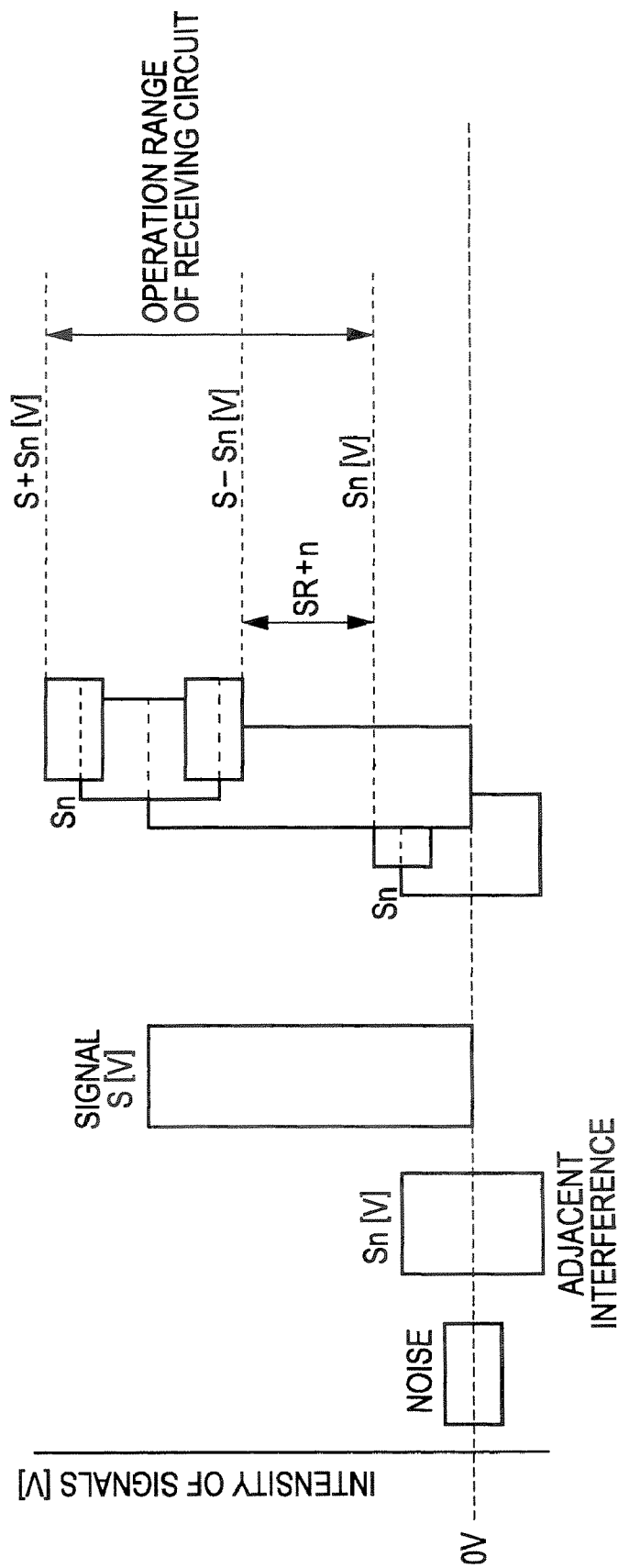
FIG. 27 illustrates an example of a setting operation of a threshold SRth.

For example, as shown in FIG. 27, suppose that the receiving module 1052-08 receives a signal (shown by a fourth bar from the left). The received signal is a communication signal having the intensity S [V] (shown by a third bar from the left) on which an adjacent interference component having the intensity Sn [V] (shown by a second bar from the left) and a faint noise component (shown by a first bar from the left) are superimposed. According to the above-described method, the threshold SRth used by the receiving module 1052-08 is set between Sn [V] and (S−Sn) [V], i.e., the communication signal detectable range. The reference voltages VR1 and VR2 are set so that the threshold SRth is set between Sn[V] and (S−Sn) [V].

The reference voltages VR1 and VR2 may be set according to another method. For example, the control unit 1053 may change the values of the reference voltages VR1 and VR2 supplied to the receiving module 1052-08 such that the threshold SRth is gradually changed from a maximum value (i.e., the threshold is gradually decreased). The control unit 1053 then may fix (or set) the reference voltages VR1 and VR2 at the values indicated just before the receiving module 1052-08 becomes capable of receiving the communication signal. Alternatively, the control unit 1053 may fix (or set) the reference voltages VR1 and VR2 at values obtained by adding given offset values to the transmission/reception thresholds.

The reference voltages VR1 and VR2 are distributed to all of the other receiving modules. That is, the same threshold SRth is set in all of the receiving modules 1052.

After setting the threshold SRth, the control unit 1053 supplies a termination signal to a transmitting module 1052 for transmitting signals so as to terminate the continuous signal transmission. Alternatively, each transmitting module 1052 may terminate the continuous signal transmission after a predetermined time period.

The above-mentioned method for setting (or calibrating) the reference voltages VR1 and VR2 will be described more specifically next.

Figure 28:
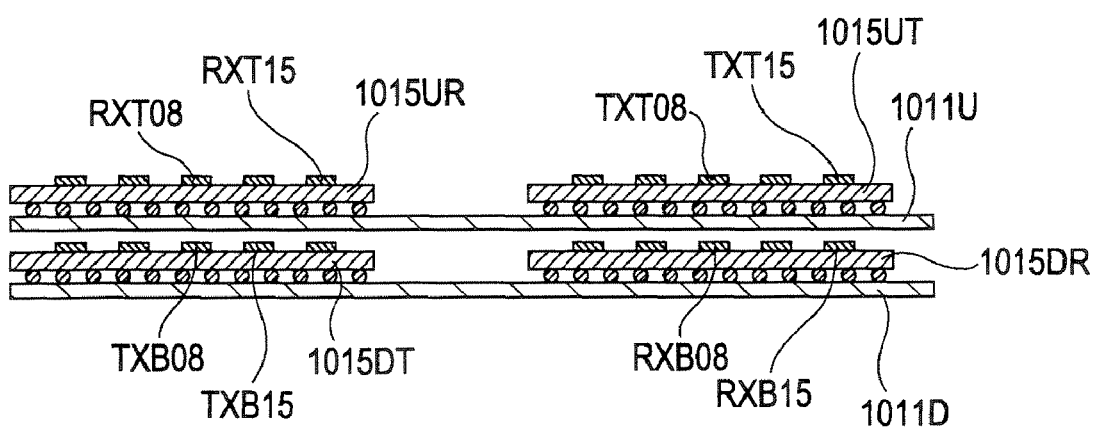
FIG. 28 is a sectional side view showing a configuration used for explaining a calibration operation.

FIG. 28 shows an example of a layered structure of the communication chip 1015 shown in FIG. 14. As shown in FIG. 28, interposers 1011U and 1011D are arranged so as to overlap each other. Communication chips 1015UR and 1015UT are mounted on the interposer 1011U, i.e., the upper layer. Communication chips 1015DT and 1015DR are mounted on the interposer 1011D, i.e., the lower layer. All of communication modules formed on the communication chips 1015DT and 1015UT are used for transmission. Likewise, all of communication modules formed on the communication chips 1015UR and 1015DR are used for reception. Each communication module of the communication chips 1015DT and 1015UT is mounted at the position corresponding to that of the corresponding communication module of the communication chips 1015UR of 1015DR, respectively.

In FIG. 28, receiving modules RXT08 and RXT15 receive signals, and correspond to the communication modules 1052-08 and 1052-15 of the communication chip 1015UR, respectively. Transmitting modules TXB08 and TXB15 transmit signals, and correspond to the communication modules 1052-08 and 1052-15 of the communication chip 1015DT, respectively. Likewise, transmitting modules TXT08 and TXT15 transmit signals, and correspond to the communication modules 1052-08 and 1052-15 of the communication chip 1015UT, respectively. Receiving modules RXB08 and RXB15 receive signals, and correspond to the communication modules 1052-08 and 1052-15 of the communication chip 1015DR, respectively.

The communication chip 1015 shown in FIG. 14 has two communication modules for performing asynchronous communication and thirteen communication modules for performing synchronous communication. An example of a calibration operation will be described below while focusing on the operations of these two communication modules 1052 (i.e., the communication modules 1052-08 and 1052-15) for performing the asynchronous communication.

Figure 29:
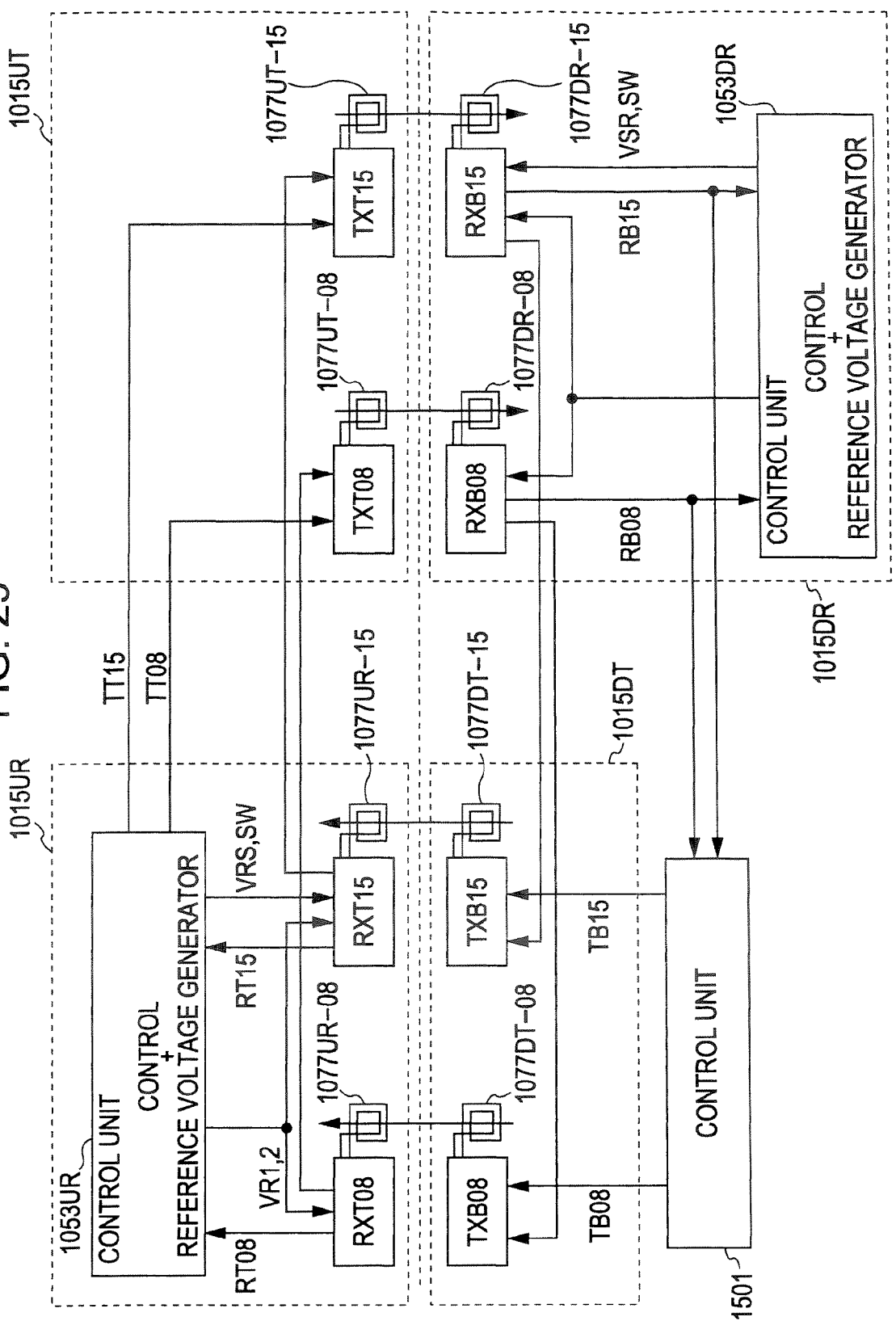
FIG. 29 is a plan view showing a configuration used for explaining a calibration operation.

FIG. 29 is a plan circuit diagram corresponding to the structural diagram shown in FIG. 28, and shows only configurations necessary for the explanation of the calibration operation. Referring to FIG. 29, a control unit 1501 controls the calibration operation. The control unit 1501 may have any configuration. For example, the control unit 1501 may be formed on one of the communication chips 1015, may be implemented on one of the interposers as a chip separated from these communication chips 1015, or may be provided outside the multi-chip package 1001.

In a normal communication, the communication module 1052-08 is used for transmitting clock signals, whereas the communication module 1052-15 is used for transmitting asynchronous signals.

The control unit 1501 supplies signals TB08 and TB15 to the transmitting modules TXB08 and TXB15 of the communication chip 1015DT, respectively.

Upon receiving the supplied signals TB08 and TB15, the transmitting modules TXB08 and TXB15 transmit the signals TB08 and TB15 to the receiving modules RXT08 and RXT15 of the communication chip 1015UR via antennas 1077DT-08 and 1077DT-15, respectively.

A control unit 1053UR in the communication chip 1015UR is a module having a controller including registers and a DC voltage generating circuit, and supplies the reference voltages VR1 and VR2 to the receiving modules RXT08 and RXT15. The receiving module RXT08 receives the signal transmitted from the transmitting module TXB08 of the communication chip 1015DT via an antenna 1077UR-08 using the reference voltages VR1 and VR2. The receiving module RXT08 then supplies the received signal to the control unit 1053UR as a signal RT08. Likewise, the receiving module RXT15 receives the signal transmitted from the transmitting module TXB15 of the communication chip 1015DT via an antenna 1077UR-15 using the reference voltages VR1 and VR2 supplied from the control unit 1053UR. The receiving module RXT15 then supplies the received signal to the control unit 1053UR as a signal RT15.

Upon receiving the signal RT08 supplied from the receiving module RXT08, the control unit 1503UR supplies the received signal to the transmitting module TXT08 of the communication chip 1015UT as a signal TT08. Likewise, upon receiving the signal RT15 supplied from the receiving module RXT15, the control unit 1503UR supplies the received signal to the transmitting module TXT15 of the communication chip 1015UT as a signal TT15.

Upon receiving the supplied signal TT08, the transmitting module TXT08 of the communication chip 1015UT transmits the signal to the receiving module RXB08 of the communication chip 1015DR via an antenna 1077UT-08. Likewise, upon receiving the supplied signal TT15, the transmitting module TXT15 of the communication chip 1015UT transmits the signal to the receiving module RXB15 of the communication chip 1015DR via an antenna 1077UT-15.

A control unit 1053DR in the communication chip 1015DR is a module having a controller including registers and a DC voltage generating circuit, and supplies the reference voltages VR1 and VR2 to the receiving modules RXB08 and RXB15. The receiving module RXB08 receives the signal transmitted from the transmitting module TXT08 of the communication chip 1015UT via an antenna 1077DR-08 using the reference voltages VR1 and VR2. The receiving module RXB08 then supplies the received signal to the control unit 1053DR and the control unit 1501 as a signal RB08. Likewise, the receiving module RXB15 receives the signal transmitted from the transmitting module TXT15 of the communication chip 1015UT via an antenna 1077DR-15 using the reference voltages VR1 and VR2 supplied from the control unit 1053DR. The receiving module RXB15 then supplies the received signal to the control unit 1053DR and the control unit 1501 as a signal RB15.

Accordingly, the signal TB08 transmitted from the control unit 1501 is returned to the control unit 1501 as the signal RB08 after going through the transmitting module TXB08, the receiving module RXT08, the control unit 1053UR, the transmitting module TXT08, and receiving module RXB08. Likewise, the signal TB15 transmitted from the control unit 1501 is returned to the control unit 1501 as the signal RB15 after going through the transmitting module TXB15, the receiving module RXT15, the control unit 1053UR, the transmitting module TXT15, and receiving module RXB15.

The transmitting modules TXB08, TXT08, TXB15, and TXT15 shown in FIG. 29 are configured to transmit signals asynchronously to the clock signals like the communication module 1052 shown in FIG. 8. The receiving modules RXT08, RXB08, RXT15, and RXB15 are configured as shown in FIG. 30.

Figure 30:
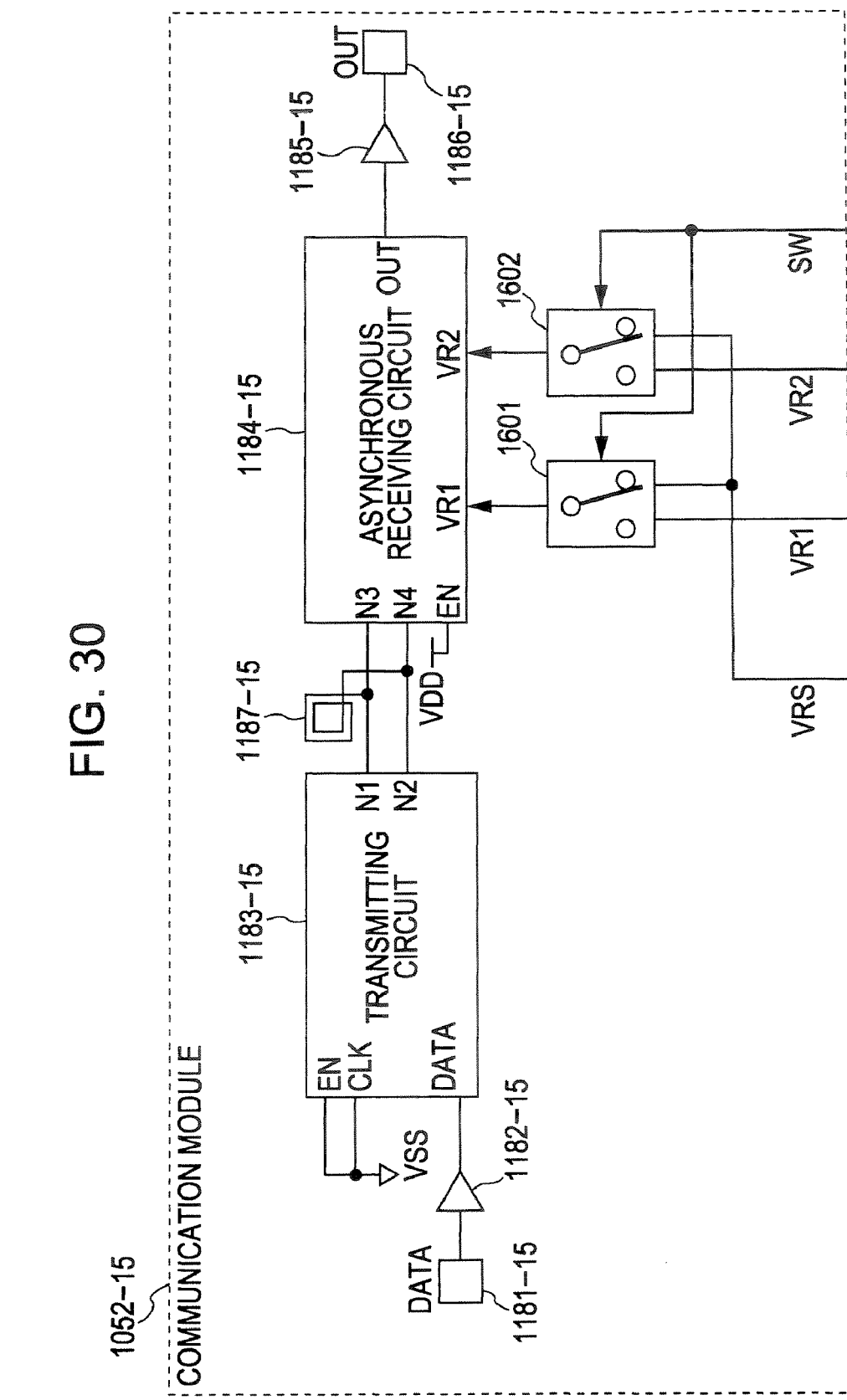
FIG. 30 is a plan view showing an example of a configuration of a receiving module that performs asynchronous communication.

FIG. 30 shows an example of a detailed configuration of the communication module 1052-15 for reception, mounted at the position denoted by numeral 15 in FIG. 14, which operates asynchronously.

Referring to FIG. 30, the communication module 1052-15 (i.e., the receiving module RXT15 or RXB15) has the same configuration as the communication module 1052-08 shown in FIG. 17. More specifically, the communication module 1052-15 includes a data terminal 1181-15, an amplifier 1182-15, a transmitting circuit 1183-15, an asynchronous receiving circuit 1184-15, an amplifier 1185-15, an output terminal 1186-15, and an antenna 1187-15.

The communication module 1052-15 further includes switching circuits 1601 and 1602. The switching circuit 1601 switches suppliers of output signals supplied from the voltage generating circuit included in the control unit 1053 on the basis of a control signals SW supplied from the control unit 1053. More specifically, the switching circuit 1601 selects either a fixed voltage VRS or the reference voltage VR1 supplied from the control unit 1053 on the basis of the control signal SW, and supplies the selected output to the asynchronous receiving circuit 1184-15 as the output of the voltage generating circuit. The switching circuit 1602 operates in the same manner as the switching circuit 1601. More specifically, the switching circuit 1602 selects either the fixed voltage VRS or the reference voltage VR2 supplied from the control unit 1053 on the basis of the control signal SW, and supplies the selected output to the asynchronous receiving circuit 1184-15 as the output of the voltage generating circuit. The fixed voltage VRS is predetermined such that the threshold SRth used by the receiving circuit is set at the minimum value (i.e., maximum sensitivity).

While the configuration of the communication module 1052-15 is described above, the communication module 1052-08 (i.e., the receiving module RXT08 or RXB08) has the same detailed configuration as the communication module 1052-15 for reception shown in FIG. 30. Thus, the description thereof is omitted.

The calibration operation performed in the above described circuit will be described with reference to flowcharts shown in FIGS. 31 to 35. Timing charts shown in FIGS. 36A to 36F are also referred to, if necessary.

For example, after the calibration operation is started at the time of power-on or the like, the control units 1053UR and 1053DR initialize the reference voltages VR1 and VR2 output from the voltage generating circuit at, for example, a minimum value (i.e., at a value where the receiving sensitivity becomes maximum) at STEP S1.

At STEP S2, the control unit 1501 transmits a calibration operation (N) entry command in order to perform the calibration operation on the reference voltages VR1 and VR2 using a noise signal (i.e., an unnecessary signal obtained in the wireless communication). FIGS. 36A to 36F are timing charts each showing a value of each signal during the calibration operation. As shown in FIGS. 36A and 36B, during an entry period T1, the control unit 1501 fixes the clock signal TB08, which works continuously during the normal working period, at a low level L, and switches the signal TB15 a predetermined number of times. The control units 1053UR and 1053DR recognize the entry command of the calibration operation by this processing of the signals.

Upon recognizing the entry command, the control unit 1053UR sets the values of the reference voltages VR1 and VR2 supplied to the receiving module RXT08 as the output of the voltage generating circuit at a value substantially equal to the fixed voltage VRS (i.e., a value where the receiving sensitivity of the receiving module RXT08 becomes maximum) at STEP S3.

At STEP S4, the control unit 1053UR controls the switching of connection of switching circuits 1601 and 1602 by supplying the control signal SW to the receiving module RXT15 so that the fixed voltage VRS is supplied to the asynchronous receiving circuit 1184 as the output of the voltage generating circuit. Likewise, the control unit 1053DR supplies the fixed voltage VRS to the receiving modules RXB08 and RXB15 as the output of the voltage generating circuit by controlling switching of connection of the switching circuits 1601 and 1602 in the receiving modules RXB08 and RXB15 using the control signal SW.

As shown in FIG. 36B, after the entry period T1, the control unit 1501 then supplies a serial command (i.e., a packet) during a command input period T2. The length of the serial command may be any length, and the serial command starts with the high level signal of the signal TB08. At STEP S5, the control unit 1501 transmits a falling edge calibration operation (N) start command using this serial command in order to set the reference voltage VR2.

Upon receiving the falling edge calibration operation (N) start command, during a noise transmission period T3 shown in FIGS. 36A to 36F, at STEP S6, some of or all of the transmitting modules TXB01 to TXB07 and TXB09 to TXB14 other than TXB08 and TXB15 of the communication chip 1015DT for transmission transmit a noise signal, shown in FIG. 36C, having the same phase as the communication signal so that the total intensity of adjacent interference Sn becomes maximum. The adjacent interference is the noise component for the receiving module RXT08. The transmitting modules TXB01 to TXB07 and TXB09 to TXB14 correspond to the communication modules 1052 mounted at the positions denoted by numerals 01 to 07 and 09 to 14 in FIG. 14. Although a high level pulse signal is transmitted as the noise signal in FIG. 36C, the noise signal may be any type of signal.

Upon receiving the noise signal, the receiving module RXT08 performs a threshold determination operation using the threshold SRth, and supplies the determination result, i.e., a signal corresponding to the noise signal, to the transmitting module TXT08 of the communication chip 1015UT through the control unit 1053UR at STEP S7. More specifically, the receiving module RXT08 supplies the noise signal to the transmitting module TXT08 as the determination result when the intensity of the noise signal Sn is greater than the threshold SRth. On the other hand, the receiving module RXT08 supplies a low level signal to the transmitting module TXT08 when the intensity of the noise signal Sn is at or lower than the threshold SRth.

Upon receiving the signal supplied from the receiving module RXT08, the transmitting module TXT08 transmits the signal to the receiving module RXB08 via the coil antenna 1077UT-08 at STEP S8.

Upon receiving the signal via the coil antenna 1077DR-08, the receiving module RXB08, like the receiving module RXT08, performs the threshold determination operation using the threshold SRth. The receiving module RXB08 then supplies the determination result to the control units 1053DR and 1501 as the signal RB08. More specifically, the receiving module RXB08 supplies the received signal as the signal RB08 when the intensity of the received signal S is greater than the threshold SRth. On the other hand, the receiving module RXB08 supplies a low level signal as the signal RB08 when the intensity of the received signal S is at or lower than the threshold SRth.

That is, when the intensity of the noise signals Sn transmitted by the transmitting modules TXB01 to TXB07 and TXB09 to TXB14 of the communication chip 1015DT is greater than the threshold SRth set in the receiving module RXT08, the noise signal is propagated through each module as described above. During a determination period T4 shown in FIGS. 36A to 36F, the high level signal is observed as the signal RB08 by the control unit 1501 (i.e., the signal RB08 is detected).

At STEP S9, the control unit 1501 determines whether or not the control unit 1501 has received the signal RB08. If the control unit 1501 determines it has received (or detected) the signal RB08, the process proceeds to STEP S10. At STEP S10, the control unit 1053UR increases the value of the reference voltage VR2 by one step (i.e., by a predetermined changing range) so as to increase the value of the threshold SRth (i.e., lower the receiving sensitivity) of the receiving module RXT08 on the basis of the determination result of the control unit 1501. The reference voltage VR2 is used to adjust the receiving sensitivity at the falling edge of the signal. After performing STEP S10, the process returns to STEP S5, and the control unit 1501 repeats the following steps.

More specifically, while each control unit gradually increases the value of the reference voltage VR2, the control unit 1501 repeatedly performs STEPs S5 to S10 until the control unit 1501 no longer receives (or detects) the signal RB08 during the determination period T13 shown in FIG. 36E (or until the control unit 1501 receives the low level signal as the signal RB08).

If the control unit 1501 determines that the control unit 1501 has not received the signal RB08 at STEP S9, the process proceeds to STEP S11. At STEP S11, the control unit 1053UR stores the reference voltage VR2 currently set in the receiving module RXT08 as the reference voltage VR2 (N) of the receiving module RXT08. After performing STEP S11, the control unit 1501 proceeds the process to STEP S21 shown in FIG. 32.

Figure 32:
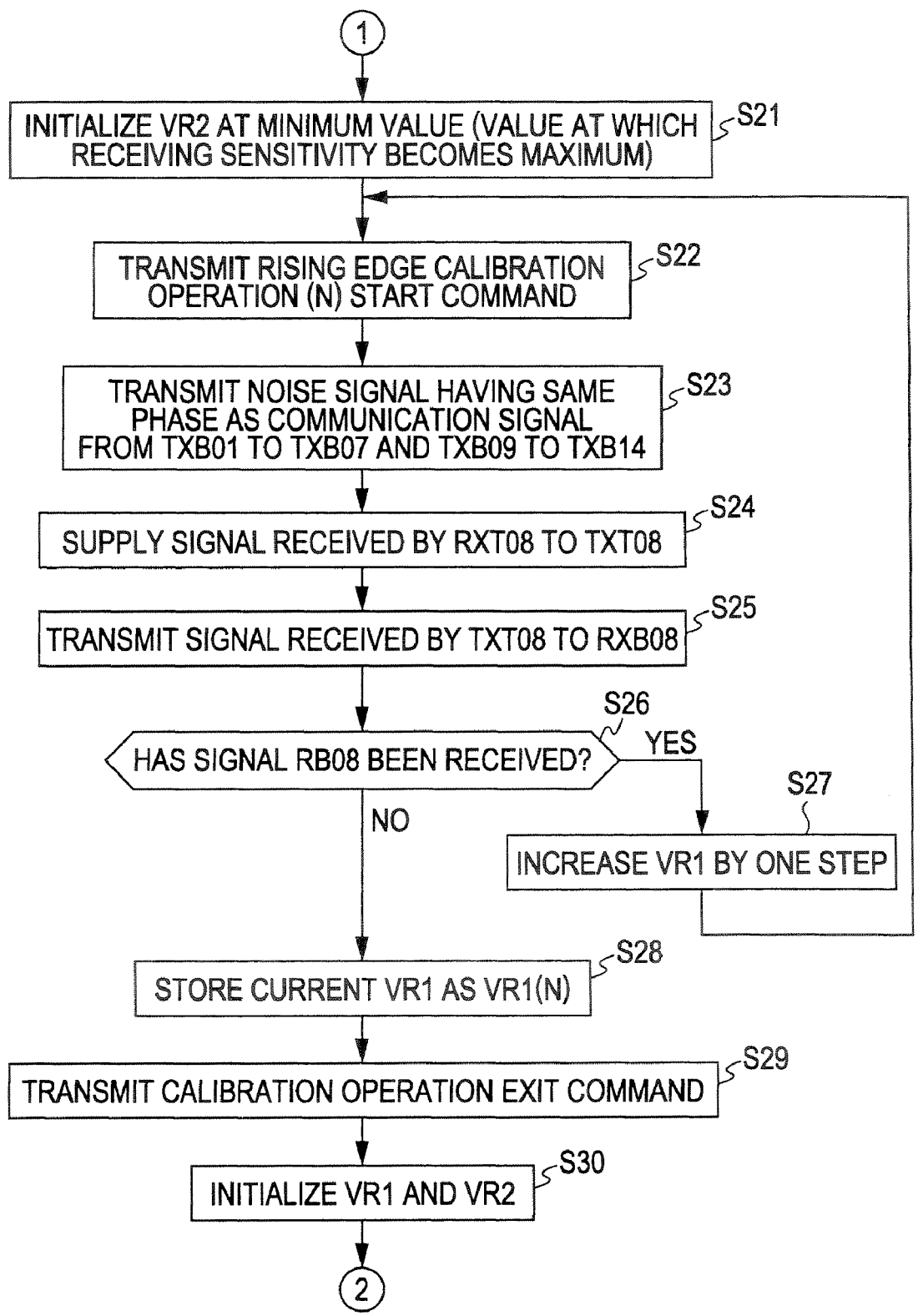
FIG. 32 is a flowchart, continued from FIG. 31, illustrating an example of a calibration operation.

At STEP S21 shown in FIG. 32, the control unit 1053UR returns (or resets) the value of the reference voltage VR2 currently set in the receiving module RXT08 to the initial value (i.e., the value where the receiving sensitivity of the receiving module RXT08 becomes maximum).

At STEP S22, during a command input period T11 shown in FIGS. 36A to 36F, the control unit 1501 transmits a rising edge calibration operation (N) start command in order to set the value of the reference voltage VR1. The rising edge calibration operation (N) start command is a serial command (i.e., a packet), which may be any length and starts with a high level of the signal TB08.

Upon receiving the rising edge calibration operation (N) start command, during a noise transmission period T12 shown in FIGS. 36A to 36F, all of or some of the transmitting modules TXB01 to TXB07 and TXB09 and TXB14 transmit noise signals having the same phases as the communication signal as shown in FIG. 36C, so that the total intensity of adjacent interference Sn becomes maximum. The adjacent interference is a noise component for the receiving module RXT08. Although the high level signal is transmitted as the noise signal in FIG. 36C, the noise signal may be any type of signal.

Upon receiving the noise signal, at STEP S24, the receiving module RXT08 supplies the noise signal to the transmitting module TXT08 as the result of the determination operation using the threshold SRth when the intensity of the noise signal Sn is greater than the threshold SRth as in the case of STEP S7. On the other hand, the receiving module RXT08 supplies the low level signal to the transmitting module TXT08 when the intensity of the noise signal Sn is at or lower than the threshold SRth.

At STEP S25, the transmitting module TXT08 transmits the signal supplied from the receiving module RXT08 to the receiving module RXB08 via the coil antenna 1077UT-08 as in the case of STEP S8.

Upon receiving the signal via the coil antenna 1077DR-08, the receiving module RXB08, like the receiving module RXT08, performs the threshold determination operation using the threshold SRth. According to the determination result, the receiving module RXB08 supplies the received signal to the control units 1501 and 1053DR as the signal RB08 when the intensity of the received signal is greater than the threshold SRth. On the other hand, the receiving module RXB08 supplies a low level signal to the control units 1501 and 1053DR as the signal RB08 when the intensity of the received signal is at or lower than the threshold SRth.

That is, as in the case of the falling edge calibration operation (N), when the intensity of the noise signal Sn received by the receiving modules RXT08 is greater than the threshold SRth set in the receiving module RXT08, the noise signal is propagated through each communication module as described above. During a determination period T13 shown in FIGS. 36A to 36F, the high level signal is observed as the signal RB08 by the control unit 1501 (i.e., the signal RB08 is detected).

At STEP S26, the control unit 1501 determines whether or not the control unit 1501 has received the signal RB08. If the control unit 1501 determines it has received (or detected) the signal RB08, the process proceeds to STEP S27. At STEP S27, the control unit 1053UR increases the value of the reference voltage VR1 by one step (i.e., by a predetermined changing range) so as to increase the value of the threshold SRth (i.e., lower the receiving sensitivity) of the receiving module RXT08 on the basis of the determination result of the control unit 1501. The reference voltage VR1 is used to adjust the receiving sensitivity at the rising edge of the signal. After performing STEP S27, the process returns to STEP S22, and the control unit 1501 repeats the following steps.

More specifically, each control unit lowers the receiving sensitivity of the receiving module RXT08 by increasing the reference voltage VR1 by one step at STEP S27 as shown in FIG. 36F, when the control unit 1501 receives (or detects) the signal RB08 during the determination period T13 as shown in FIG. 36E. The each control unit then repeats STEPs S22 to S26 again. Accordingly, each control unit repeatedly performs STEPs S22 to S27 until the control unit 1501 no longer receives the signal RB08 during the determination period T13 (i.e., until the low level signal is received as the signal RB08).

If the control unit 1501 determines that the control unit 1501 has not received the signal RB08 at STEP S26, the control unit 1501 proceeds the process to STEP S28. At STEP S28, the control unit 1053UR stores the reference voltage VR1 currently set in the receiving module RXT08 as the reference voltage VR1 (N) of the receiving module RXT08. After performing STEP S28, the control unit 1501 transmits a calibration operation exit command in order to perform a calibration operation for the communication signal next. At STEP S30, the control unit 1501 initializes the current settings of the reference voltages VR1 and VR2 of all receiving circuits. After the initialization, the control unit 1501 proceeds the process to STEP S41 shown in FIG. 33.

The calibration operation for the communication signal is performed substantially in the same manner as that of the noise signal.

Figure 33:
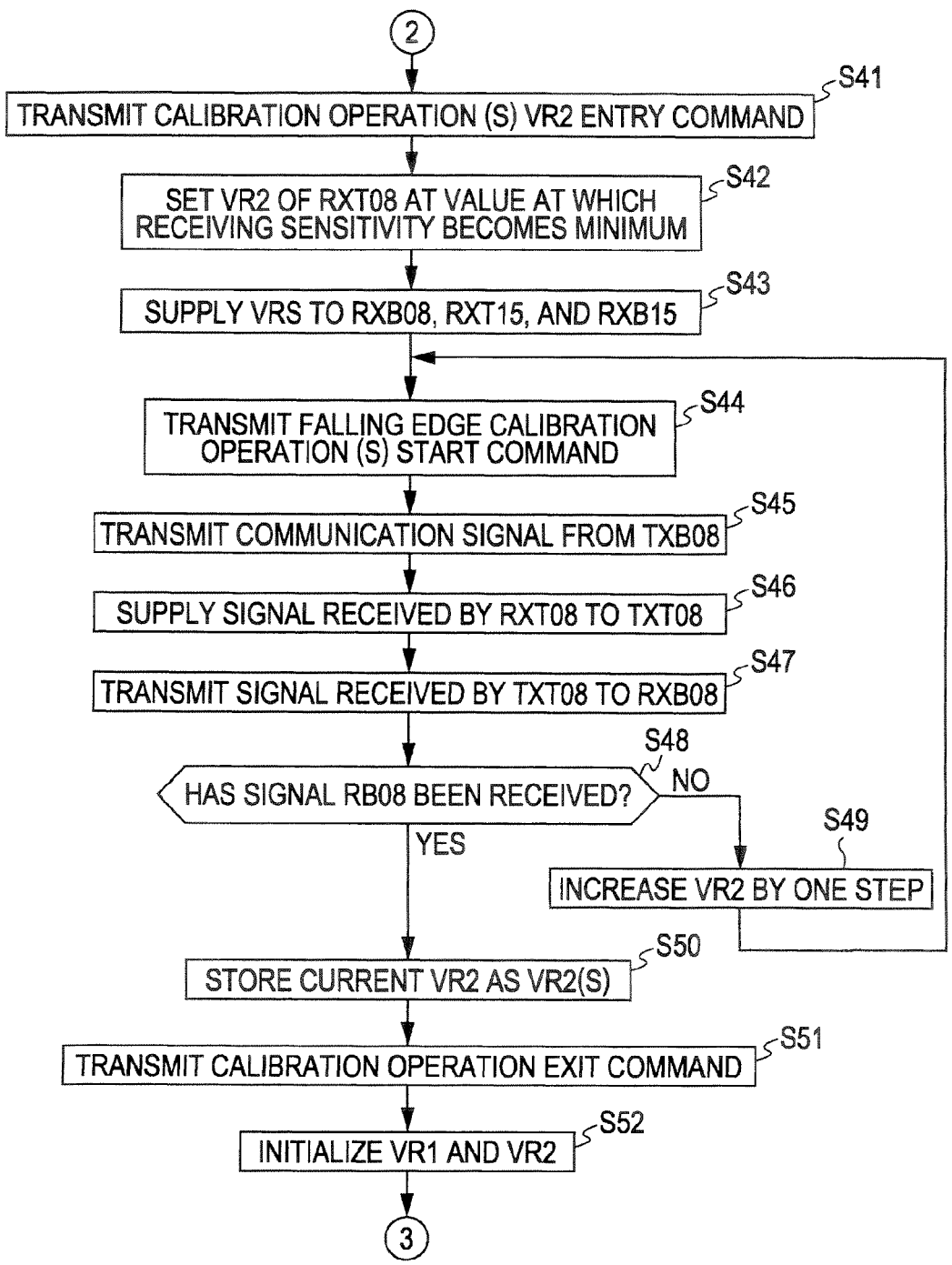
FIG. 33 is a flowchart, continued from FIG. 32, illustrating an example of a calibration operation.

At STEP S41 shown in FIG. 33, during the entry period T1, the control unit 1501 transmits a calibration operation (S) VR2 entry command in order to perform the calibration operation on the reference voltage VR2 used for receiving the communication signal (i.e., the desired signal in the wireless communication). At STEP S42, the control unit 1053UR sets the value of the reference voltage VR2 supplied to the receiving module RXT08 at a maximum value contrary to the calibration operation on the noise signals, so that the receiving sensitivity of the receiving module RXT08 becomes minimum.

At STEP S43, the control unit 1053UR further sets the value of the output of the voltage generating circuit, which is supplied to the receiving module RXT15, at the fixed voltage VRS. Likewise, the control unit 1053DR sets the value of the output of the voltage generating circuit, which is supplied to the receiving modules RXB08 and RXB15, at the fixed voltage VRS.

At STEP S44, during the command input period T2, the control unit 1501 transmits a falling edge calibration operation (S) start command. The falling edge calibration operation (S) start command is a serial command (i.e., a packet), which may be any length and starts with a high level of the signal TB08.

Upon receiving the falling edge calibration operation (S) start command, during a communication signal transmission period, which corresponds to the noise transmission period shown in FIGS. 36A to 36F, the transmitting module TXB08 transmits a communication signal having the intensity S at STEP S45. The communication signal may be any type of signal.

Upon receiving the communication signal, the receiving module RXT08 performs a threshold determination operation using the threshold SRth. At STEP S46, according to the determination result, the receiving module RXT08 supplies the communication signal to the transmitting module TXT08 through the control unit 1053UR when the intensity of the communication signal S is greater than the threshold SRth. On the other hand, the receiving module RXT08 supplies a low level signal L to the transmitting module TXT08 through the control unit 1053UR when the intensity of the communication signal S is at or lower than the threshold SRth.

Upon receiving the signal supplied from the receiving module RXT08, the transmitting module TXT08 transmits the signal to the receiving module RXB08 via the coil antenna 1077UT-08 at STEP S47.

Upon receiving the signal via coil antenna 1077DR-08, the receiving module RXB08, like the receiving module RXT08, performs the threshold determination operation using the threshold SRth. According to the determination result, the receiving module RXB08 supplies the received signal to the control units 1053DR and 1501 as the signal RB08, when the intensity of the received signal is greater than the threshold SRth. On the other hand, the receiving module RXB08 supplies a low level signal to the control units 1053UR and 1501 as the signal RB08, when the intensity of the received signal is at or lower than the threshold SRth.

That is, when the intensity of the communication signal S transmitted by the transmitting module TXB08 of the communication chip 1015DT is greater than the threshold SRth set in the receiving module RXT08, the communication signal is propagated through each communication module as described above. During the determination period T13 shown in FIGS. 36A to 36F, a high level signal is observed as the signal RB08 by the control unit 1501 (i.e., the signal RB08 is detected).

At STEP S48, the control unit 1501 determines whether or not the control unit 1501 has received the signal RB08. If the control unit 1501 determines it has not received (or detected) the signal RB08, the process proceeds to STEP S49. At STEP S49, contrary to the calibration operation for the noise signal, the control unit 1053UR decreases the value of the reference voltage VR2 by one step (i.e., by a predetermined changing range) so as to decrease the value of the threshold SRth (i.e., increase the receiving sensitivity) of the receiving module RXT08 on the basis of the determination result of the control unit 1501. The reference voltage VR2 is used to adjust the receiving sensitivity at the falling edge of the signal. After performing STEP S49, the process returns to STEP S44, and the control unit 1501 repeats the following steps.

More specifically, while each control unit gradually decrease the value of the reference voltage VR2, the control unit 1501 repeatedly performs STEPs S44 to S49 until the control unit 1501 receives (i.e., detects) the signal RB08 during the determination period T13 (i.e., until the control unit 1501 receives the high level signal as the signal RB08).

If the control unit 1501 determines that the control unit 1501 has received the signal RB08 at STEP S48, the process proceeds to STEP S50. At STEP S50, the control unit 1053UR stores the reference voltage VR2 currently set in the receiving module RXT08 as the reference voltage VR2 (S) of the receiving module RXT08. After performing STEP S50, the control unit 1501 proceeds the process to STEP S51.

At STEP S51, the control unit 1501 transmits a calibration operation exit command as in the case of STEP S29 shown in FIG. 32. At STEP S52, the control unit 1501 initializes the current settings of the reference voltages VR1 and VR2 of all receiving circuits as in the case of STEP S30 shown in FIG. 32. After the initialization, the control unit 1501 proceeds the process to STEP S61 shown in FIG. 34.

Figure 34:
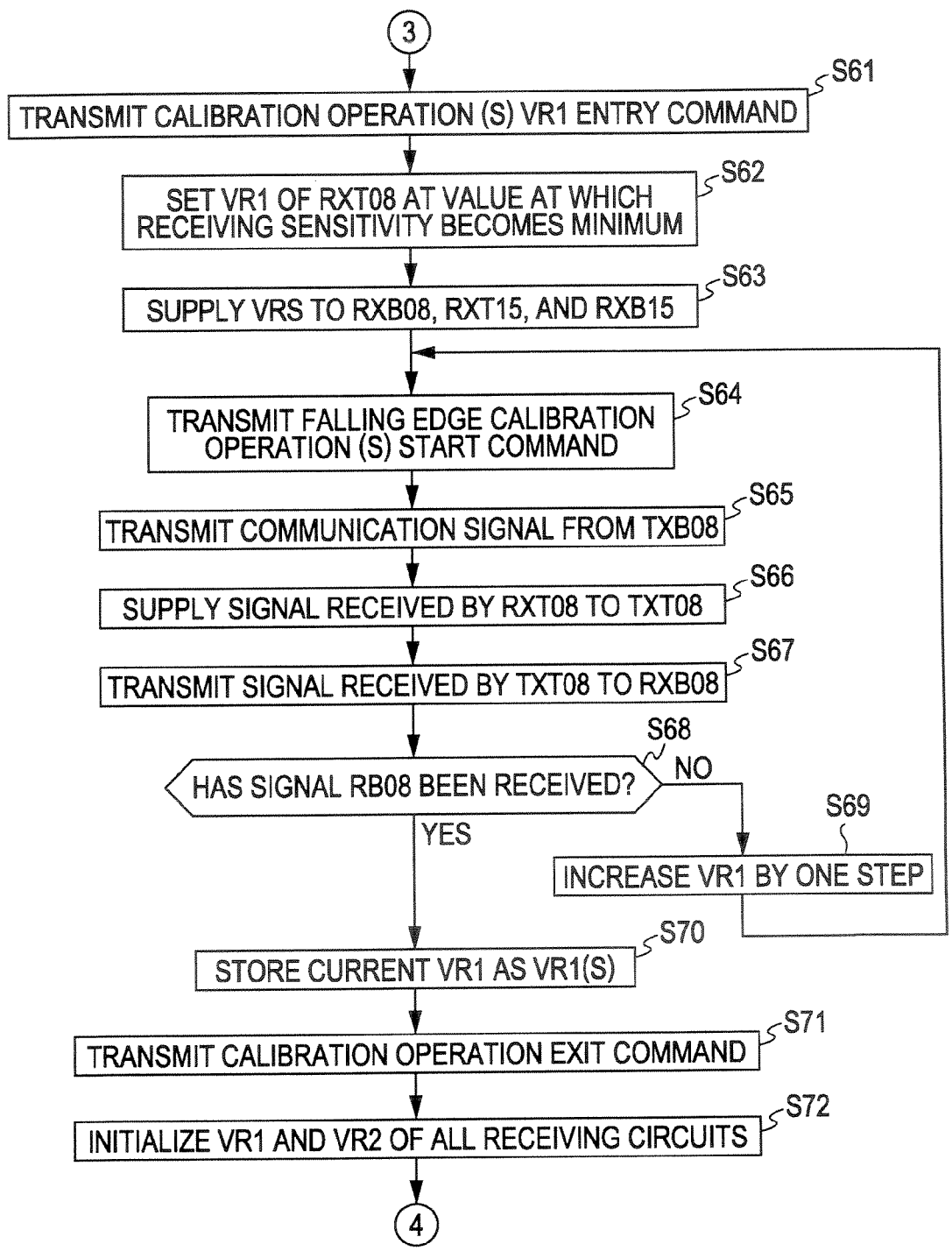
FIG. 34 is a flowchart, continued from FIG. 33, illustrating an example of a calibration operation.

At STEP S61 shown in FIG. 34, during the entry period T1, the control unit 1501 transmits a calibration operation (S) VR1 entry command in order to perform the calibration operation on the reference voltage VR1 used for receiving the communication signal as in the case of STEP S41 shown in FIG. 33. At STEP S62, the control unit 1053UR sets the value of the reference voltage VR1 supplied to the receiving module RXT08 at a maximum value contrary to the calibration operation for the noise signals, so that the receiving sensitivity of the receiving module RXT08 becomes minimum.

At STEP S63, the control unit 1053UR further sets the value of the output of the voltage generating circuit, which is supplied to the receiving module RXT15, at the fixed voltage VRS. Likewise, the control unit 1053DR sets the value of the output of the voltage generating circuit, which is supplied to the receiving modules RXB08 and RXB15, at the fixed voltage VRS.

At STEP S64, during the command input period T2 shown in FIGS. 36A to 36F, the control unit 1501 transmits a rising edge calibration operation (S) start command to set the reference voltage VR1. The rising edge calibration operation (S) start command is a serial command (i.e., a packet), which is may be any length and starts with a high level of the signal TB08.

Upon receiving the rising edge calibration operation (S) start command, during the communication signal transmission period, which corresponds to the noise transmission period shown in FIGS. 36A to 36F, the transmitting module TXB08 transmits a communication signal having the intensity S at STEP S65. The communication signal may be any type of signal.

Upon receiving the communication signal, the receiving module RXT08 performs a threshold determination operation using the threshold SRth. At STEP S66, according to the determination result, the receiving module RXT08 supplies the communication signal to the transmitting module TXT08 through the control unit 1053UR when the intensity of the communication signal S is greater than the threshold SRth. On the other hand, the receiving module RXT08 supplies a low level signal L to the transmitting module TXT08 through the control unit 1053UR when the intensity of the communication signal S is at or lower than the threshold SRth.

Upon receiving the signal supplied from the receiving module RXT08, the transmitting module TXT08 transmits the signal to the receiving module RXB08 via the coil antenna 1077UT-08 at STEP S67.

Upon receiving the signal via coil antenna 1077DR-08, the receiving module RXB08, like the receiving module RXT08, performs the threshold determination operation using the threshold SRth. According to the determination result, the receiving module RXB08 supplies the received signal to the control units 1053DR and 1501 as the signal RB08, when the intensity of the received signal is greater than the threshold SRth. On the other hand, the receiving module RXB08 supplies a low level signal to the control units 1053UR and 1501 as the signal RB08, when the intensity of the received signal is at or lower than the threshold SRth.

That is, when the intensity of the communication signal S transmitted by the transmitting module TXB08 of the communication chip 1015DT is greater than the threshold SRth set in the receiving module RXT08, the communication signal is propagated through each communication module as described above. During a determination period T13 shown in FIGS. 36A to 36F, a high level signal is observed as the signal RB08 by the control unit 1501 (i.e., the signal RB08 is detected).

At STEP S68, the control unit 1501 determines whether or not the control unit 1501 has received the signal RB08. If the control unit 1501 determines it has not received (or detected) the signal RB08, the process proceeds to STEP S69. At STEP S69, contrary to the calibration operation for the noise signal, the control unit 1053UR decreases the value of the reference voltage VR1 by one step (i.e., by a predetermined changing range) so as to decrease the value of the threshold SRth (i.e., increase the receiving sensitivity) of the receiving module RXT08 on the basis of the determination result of the control unit 1501. The reference voltage VR1 is used to adjust the receiving sensitivity at the rising edge of the signal. After performing STEP S69, the process returns to STEP S64, and the control unit 1501 repeats the following steps.

More specifically, while each control unit gradually decreases the value of the reference voltage VR1, the control unit 1501 repeatedly performs STEPs S64 to S69 until the control unit 1501 receives (or detects) the signal RB08 during the determination period T13 (or until the control unit 1501 receives the high level signal as the signal RB08).

If the control unit 1501 determines that the control unit 1501 has received the signal RB08 at STEP S68, the control unit 1501 proceeds the process to STEP S70. At STEP S70, the control unit 1053UR stores the reference voltage VR1 currently set in the receiving module RXT08 as the reference voltage VR1 (S) of the receiving module RXT08. After performing STEP S70, the control unit 1501 proceeds the process to STEP S71.

At STEP S71, the control unit 1501 transmits a calibration operation exit command as in the case of STEP S51 shown in FIG. 33. At STEP S72, the control unit 1501 initializes the current settings of the reference voltages VR1 and VR2 of all receiving circuits as in the case of the STEP S52 shown in FIG. 33. After the initialization, the control unit 1501 proceeds the process to STEP S81 shown in FIG. 35.

After performing the above-described steps so as to perform the calibration operation on the reference voltages VR1 and VR2, which adjust the receiving sensitivity at the rising and falling edges of the received signal, using the noise signal and the communication signal, the control unit 1501 transmits a VR setting operation entry command at STEP S81 shown in FIG. 35.

At STEP S82, the control unit 1053UR sets the reference voltage VR1 of the receiving module RTX08 so that the receiving sensitivity of the receiving module RTX08 becomes minimum.

At STEP S83, the control unit 1501 calculates the reference voltage VR1 of the receiving module RTX08 by performing a subtraction operation of VR1(S)−2VR1(N). In addition, at STEP S84, the control unit 1501 calculates the reference voltage VR2 of the receiving module RTX08 by performing a subtraction operation of VR2(S)−2VR2(N).

At STEP S85, the control unit 1053UR obtains the results of the calculation operations performed at STEPs S83 and S84 from the control unit 1501. The control unit 1053UR then sets the reference voltages VR1 and VR2 of all RXT circuits (i.e., all of the receiving modules RXT01 to RXT15 of the communication chip 1015UR) at the obtained values. Likewise, at STEP S86, the control unit 1053DR obtains the results of the calculation operations performed at STEPs S83 and S84 from the control unit 1501. The control unit 1053DR then sets the reference voltages VR1 and VR2 of all RXB circuits (i.e., all of the receiving modules RXB01 to RXB15 of the communication chip 1015DR) at the obtained values.

After setting the reference voltages, at STEP S87, the control unit 1501 transmits a VR setting operation exit command, and finishes the calibration operation.

During the calibration operation, the receiving modules RXB08, RXT15, and RXB15 are supplied with the fixed voltage VRS. After completion of the calibration operation, the control unit 1501 switches the connection of the switching circuits 1601 and 1602 of each receiving module using the control signal SW so as to supply the reference voltages VR1 and VR2 to each receiving module and utilize each receiving module as an ordinary asynchronous communication module.

As described above, a loop path is constructed by all of or some of a plurality of communication chips (more specifically, communication modules) and the calibration operation on the reference voltages VR1 and VR2 is performed using the loop path. This allows the threshold SRth of the receiving circuit in each communication chip 1015 to be set more easily and more appropriately, thus enabling more stable communication by decreasing effects of external factors, such as a noise, on the communication. In addition, this allows each communication chip 1015 to have a broader communication range for the communication with other communication chips.

Furthermore, each communication chip 1015 includes switching circuits 1601 and 1602 for switching voltages VR1, VR2, and VRS supplied to the receiving circuit of each receiving module 1052 from the control unit 1053. This allows the control unit 1053 to select the receiving module on which the calibration operation is performed, and to supply the reference voltages VR1 and VR2, i.e., parameters, only to the selected receiving module and the fixed voltage VRS to other receiving modules. Accordingly, the calibration operation can be performed in each communication chip 1015 more easily.

In practice, since noises (such as a thermal noise) exist in a natural world, even when the reference voltages VR1 and VR2 are set such that the value of the threshold SRth becomes minimum (i.e., the receiving sensitivity of the receiving module becomes maximum), for example, as described above, the value of the threshold SRth is not the minimum value, strictly speaking. The value of the threshold SRth is large enough to suppress the noises exists in the natural world.

In this specification, the steps described in a program include processing that is executed sequentially in the described order, and also includes processing that is executed in parallel or individually, not necessarily sequentially.

Additionally, the above-described control operation of the calibration operations may be executed by hardware or software.

Furthermore, in this specification, the term "system" indicates the entire apparatus including a plurality of devices.

Moreover, the embodiments of the present invention should not be limited to the above described embodiments, and various modifications can be made without departing from the spirit and scope of the present invention.

What is claimed is:

1. A communication semiconductor chip that performs wireless communication with another communication semiconductor chip, the semiconductor chip comprising:
 a communication module that includes a receiving circuit for receiving data and performs wireless communication with the another communication semiconductor chip, the communication semiconductor chip and the another communication semiconductor chip each encapsulated in a same multi-chip package; and
 a control unit that supplies a reference voltage to the receiving circuit and performs a calibration operation on the reference voltage through a voltage loop path, to set at least one of a rising edge threshold or a falling edge threshold of the receiving circuit, the voltage loop path including a voltage path through at least the communication semiconductor chip and the another communication semiconductor chip.

2. The communication semiconductor chip according to claim 1, wherein
 the reference voltage is at least one of a first reference voltage that allows adjustment of a receiving sensitivity of the receiving circuit at the rising edge threshold of a received signal or a second reference voltage that allows adjustment of the receiving sensitivity of the receiving circuit at the falling edge threshold of the received signal and
 the control unit supplies the first or second reference voltage to the receiving circuit.

3. The communication semiconductor chip according to claim 1, wherein
 the control unit performs the calibration operation on the reference voltage using an unnecessary noise signal obtained in the wireless communication and a desired communication signal in the wireless communication.

4. The communication semiconductor chip according to claim 1, wherein
 a plurality of communication modules are mounted on the communication semiconductor chip,
 each of the plurality of communication modules communicates with a corresponding communication module mounted at a corresponding position among a plurality of communication modules mounted on the another communication semiconductor chip, and
 each of the plurality of communication modules receives data.

5. The communication semiconductor chip according to claim 4, wherein
 the control unit performs the calibration operation on the reference voltage using an unnecessary adjacent interference noise signal transmitted from a communication module mounted at a position other than the corresponding position in the another communication semiconductor chip.

6. The communication semiconductor chip according to claim 4, wherein
 the control unit performs the calibration operation on the reference voltage in at least one communication module among the plurality of communication modules and supplies an obtained reference voltage to other communication modules.

7. The communication semiconductor chip according to claim 6, wherein,
 during the calibration operation on the reference voltage, the control unit supplies a reference voltage that allows a maximum receiving sensitivity of the communication module to other communication modules on which the calibration operation is not performed.

8. The communication semiconductor chip according to claim 4, wherein
 the plurality of communication modules are arranged in a matrix in a plane on the communication semiconductor chip.

9. A method for performing a calibration operation on a reference voltage supplied to a receiving circuit in a semiconductor device having a plurality of communication semiconductor chips encapsulated in a same multi-chip package, each of the plurality of communication semiconductor chips having a communication module that performs wireless communication, each communication module having at least one of a transmitting circuit for transmitting signals and at least one receiving circuit for receiving signals, and each communication module to perform wireless communication using the at least one transmitting circuit or the at least one receiving circuit, the method comprising the steps of:
 selecting at least one of the communication modules having a receiving circuit for performing a calibration operation on a reference voltage;
 causing a communication module for transmission, which transmits a signal to the selected communication module for performing the calibration, to transmit a signal to the selected communication module for performing the calibration by supplying a predetermined signal to the communication module for transmission;
 detecting the signal transmitted from the communication module for transmission and received by the selected communication module for performing the calibration through a loop path constructed by at least two of the plurality of the communication semiconductor chips; and
 performing the calibration operation on the reference voltage on the basis of a result of the signal detection.

10. A computer-readable storage medium storing a program causing a processor to perform a calibration operation on a reference voltage supplied to a receiving circuit in semiconductor device having a plurality of communication semiconductor chips encapsulated in a same multi-chip package, each of the plurality of communication semiconductor chips having a communication module that performs wireless communication, each communication module having at least one of a transmitting circuit for transmitting signals and at least one receiving circuit for receiving signals, and each communication module to perform wireless communication using the at least one transmitting circuit or the at least one receiving circuit, the program, when executed by the processor, directing the processor to execute the steps of:
 selecting at least one of the communication modules having a receiving circuit for performing a calibration operation on a reference voltage;
 causing a communication module for transmission, which transmits a signal to the selected communication module for performing the calibration, to transmit a signal to the selected communication module for performing the calibration by supplying a predetermined signal to the communication module for transmission;
 detecting the signal transmitted from the communication module for transmission and received by the selected communication module for performing calibration through a loop path constructed by at least two of the plurality of the communication semiconductor chips; and performing the calibration operation on the reference voltage on the basis of a result of the signal detection.

11. The method for performing a calibration operation on a reference voltage according to claim 9, the reference voltage being a first reference voltage that allows adjustment of a receiving sensitivity at a rising edge of a received signal or a second reference voltage that allows adjustment of the receiving sensitivity at a falling edge of the received signal.

12. The computer-readable storage medium storing a program of claim 10, the reference voltage being a first reference voltage that allows adjustment of a receiving sensitivity at a rising edge of a received signal or a second reference voltage that allows adjustment of the receiving sensitivity at a falling edge of the received signal.

13. The communication semiconductor chip according to claim 1, wherein the at least one of the rising edge threshold or the falling edge threshold is set as a threshold voltage.

14. The communication semiconductor chip according to claim 1, wherein the calibration operation is performed through a loop path created between at least two of the plurality of the communication semiconductor chips.

* * * * *